US008860410B2

(12) United States Patent
Petrie

(10) Patent No.: US 8,860,410 B2
(45) Date of Patent: Oct. 14, 2014

(54) CIRCUITS AND METHODS FOR PROCESSING A SIGNAL GENERATED BY A PLURALITY OF MEASURING DEVICES

(75) Inventor: Craig S. Petrie, Merrimack, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 439 days.

(21) Appl. No.: 13/113,603

(22) Filed: May 23, 2011

(65) Prior Publication Data

US 2012/0299588 A1 Nov. 29, 2012

(51) Int. Cl.
*G01R 33/06* (2006.01)
*G01R 33/00* (2006.01)
*G01R 33/07* (2006.01)

(52) U.S. Cl.
CPC .......... *G01R 33/0029* (2013.01); *G01R 33/077* (2013.01)
USPC .............. 324/251; 324/207.2; 438/3; 257/48; 257/421; 257/427

(58) Field of Classification Search
USPC ................................ 438/3; 257/48, 421–427, 257/E43.001–E43.003, E43.007; 324/251, 324/207.2
See application file for complete search history.

(56) References Cited

U.S. PATENT DOCUMENTS 4,668,914 A 5/1987 Kersten et al.
4,761,569 A 8/1988 Higgs
4,829,352 A 5/1989 Popovic et al.
5,541,506 A 7/1996 Kawakita et al.
5,572,058 A 11/1996 Biard
5,612,618 A 3/1997 Arakawa
5,619,137 A 4/1997 Vig et al.
5,621,319 A 4/1997 Bilotti et al.
5,657,189 A 8/1997 Sandhu
5,694,038 A 12/1997 Moody et al.
5,831,513 A 11/1998 Lue
5,844,411 A 12/1998 Vogt
5,942,895 A 8/1999 Popovic et al.
6,064,199 A 5/2000 Walter et al.
6,064,202 A 5/2000 Steiner et al.
6,073,043 A * 6/2000 Schneider .................... 600/424
6,091,239 A 7/2000 Vig et al.

(Continued)

FOREIGN PATENT DOCUMENTS

CN 101995558 A 3/2011
CN 102171588 A 8/2011

(Continued)

OTHER PUBLICATIONS

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

(Continued)

*Primary Examiner* — Huy Q Phan
*Assistant Examiner* — Temilade S Rhodes-Vivour
(74) *Attorney, Agent, or Firm* — Daly, Crowley, Mofford & Durkee, LLP

(57) ABSTRACT

Circuits and methods use a feedback arrangement to select one or more measuring devices from a plurality of measuring devices in order to rapidly identify a direction of a sensed parameter. In some embodiments, the plurality of measuring devices corresponds to a plurality of magnetic field sensing elements and the sensed parameter is a magnetic field.

35 Claims, 16 Drawing Sheets

(56) References Cited

U.S. PATENT DOCUMENTS

| | | | | |
|---|---|---|---|---|
| 6,100,680 | A | 8/2000 | Vig et al. | |
| 6,166,535 | A | 12/2000 | Irle et al. | |
| 6,232,768 | B1 | 5/2001 | Moody et al. | |
| 6,236,199 | B1 | 5/2001 | Irle et al. | |
| 6,265,864 | B1 | 7/2001 | De Winter et al. | |
| 6,288,533 | B1 | 9/2001 | Haeberli et al. | |
| 6,297,627 | B1 | 10/2001 | Towne et al. | |
| 6,356,741 | B1 | 3/2002 | Bilotti et al. | |
| 6,525,531 | B2 | 2/2003 | Forrest et al. | |
| 6,542,068 | B1 | 4/2003 | Drapp et al. | |
| 6,545,462 | B2 | 4/2003 | Schott et al. | |
| 6,622,012 | B2 | 9/2003 | Bilotti et al. | |
| 6,768,301 | B1 | 7/2004 | Hohe et al. | |
| 6,969,988 | B2 | 11/2005 | Kakuta et al. | |
| 7,030,606 | B2 | 4/2006 | Kato et al. | |
| 7,038,448 | B2 | 5/2006 | Schott et al. | |
| 7,085,119 | B2 | 8/2006 | Bilotti et al. | |
| 7,119,538 | B2 | 10/2006 | Blossfeld | |
| 7,159,556 | B2 | 1/2007 | Yoshihara | |
| 7,235,968 | B2 | 6/2007 | Popovic et al. | |
| 7,259,556 | B2 | 8/2007 | Popovic et al. | |
| 7,307,824 | B2 | 12/2007 | Bilotti et al. | |
| 7,362,094 | B2 | 4/2008 | Voisine et al. | |
| 7,714,570 | B2 | 5/2010 | Thomas et al. | |
| 7,746,065 | B2 | 6/2010 | Pastre et al. | |
| 7,759,929 | B2 | 7/2010 | Forsyth | |
| 7,797,604 | B2 * | 9/2010 | Lee et al. | 714/748 |
| 7,872,322 | B2 | 1/2011 | Schott et al. | |
| 7,911,203 | B2 | 3/2011 | Thomas et al. | |
| 7,965,076 | B2 | 6/2011 | Schott | |
| 7,994,774 | B2 | 8/2011 | Thomas et al. | |
| 2002/0114269 | A1 * | 8/2002 | Onggosanusi et al. | 370/208 |
| 2006/0011999 | A1 | 1/2006 | Schott et al. | |
| 2007/0029998 | A1 | 2/2007 | Popovic et al. | |
| 2007/0105244 | A1 * | 5/2007 | Okita | 438/14 |
| 2008/0100285 | A1 | 5/2008 | Matsumoto et al. | |
| 2009/0001965 | A1 | 1/2009 | Ausserlechner et al. | |
| 2009/0121707 | A1 | 5/2009 | Schott | |
| 2009/0174395 | A1 | 7/2009 | Thomas et al. | |
| 2010/0026282 | A1 | 2/2010 | Kaita et al. | |
| 2010/0102809 | A1 | 4/2010 | May | |
| 2010/0133632 | A1 * | 6/2010 | Schott | 257/427 |
| 2010/0156397 | A1 | 6/2010 | Yabusaki et al. | |
| 2010/0164491 | A1 | 7/2010 | Kejik et al. | |
| 2010/0181993 | A1 | 7/2010 | Fernandez et al. | |
| 2011/0031965 | A1 | 2/2011 | Saruki et al. | |
| 2011/0248708 | A1 | 10/2011 | Thomas et al. | |
| 2011/0298447 | A1 * | 12/2011 | Foletto et al. | 324/207.2 |

FOREIGN PATENT DOCUMENTS

| | | | |
|---|---|---|---|
| CN | 102193073 | A | 9/2011 |
| DE | 10 2005 014 509 | B4 | 10/2006 |
| DE | 10 2006 037 226 | A1 | 2/2008 |
| DE | 10 2007 036 984 | A1 | 1/2009 |
| DE | 10 2010 010 560 | B3 | 9/2011 |
| EP | 0 631 416 | B1 | 12/1994 |
| EP | 0 875 733 | B1 | 11/1998 |
| EP | 0 916 074 | B1 | 5/1999 |
| EP | 2 000 814 | A2 | 12/2008 |
| JP | 58-055688 | A | 4/1983 |
| JP | 2003-042709 | | 2/2003 |
| JP | 2005-241269 | | 9/2005 |
| JP | 2010-014607 | | 1/2010 |
| JP | 2010-078366 | | 4/2010 |
| TW | 200643376 | | 12/2006 |
| WO | WO 98/10302 | | 3/1998 |
| WO | WO 98/54547 | | 12/1998 |
| WO | WO 00/02266 | | 1/2000 |
| WO | WO 03/036732 | A2 | 5/2003 |
| WO | WO 2004/025742 | A1 | 3/2004 |
| WO | WO 2005/029106 | A1 | 3/2005 |
| WO | WO 2006/056289 | A1 | 6/2006 |
| WO | WO 2006/074989 | A2 | 7/2006 |
| WO | WO 2008/145662 | A1 | 12/2008 |
| WO | WO 2008 145662 | A1 | 12/2008 |
| WO | WO 2009/124969 | A1 | 10/2009 |

OTHER PUBLICATIONS

Allegro Microsystems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensors with Adjustable Bandwidth (50 kHz Maximum) and Analog Output;" published Mar. 18, 2008; pp. 1-25.

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPoS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall- Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; Allegro Microsystems, Inc.; "AN296061 Data Sheet: Ring Magnet Speed Sensing for Electronic Power Steering;" published Jul. 21, 2009; pp. 1-4.

Freitas et al.; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with On Chip Read-Out Circuit;" The 8th International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceedings of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

(56) References Cited

OTHER PUBLICATIONS

Masson et al.; "Multiturn and high precision through-shaft magnetic sensors;" Sensor+Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.

Petoussis et al.; "A Novel Hall Effect Sensor Using Elaborate Offset Cancellation Method;" Sensors & Transducers Journal, vol. 100, Issue 1; Jan. 2009; pp. 85-91.

Popovic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20ll/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Voider; "The CORDIC Trigonometric Computing Technique;" The Institute of Radio Engineers, Inc.; IRE Transactions on Electronic Computers, vol. EC, Issue 3; Sep. 1959; pp. 226-230.

PCT Invitation to Pay Additional Fees with Partial Search Report; dated Feb. 6, 2013; for PCT Pat. App. No. PCT/US2012/052639; 7 pages.

Petrie; "Circuit and Method for Processing Signals Generated by a Plurality of Sensors;" U.S. Appl. No. 13/035,257, filed Feb. 25, 2011; 52 pages.

Donovan et al.; "Circuits and Methods for Processing Signals Generated by a Plurality of Magnetic Field Sensing Elements;" U.S. Appl. No. 13/247,139, filed Sep. 28, 2011; 69 pages.

Petrie; "Circular Vertical Hall Mangetic Field Sensing Element and Method With a Plurality of Continuous Output Signals;" U.S. Appl. No. 13/035,243, filed Feb. 25, 2011; 56 pages.

Allegro Microsystems, Inc.; "High Precision Linear Hall Effect Sensor IC with a Push/Pull, Pulse Width Modulated Output;" A1351; pp. 1-23.

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34$^{th}$ Annual Conference of IEEE Industrial Electronics; IECON; Nov. 10-13, 2008; pp. 1777-1781.

Kejik, et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corporation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with $I^2C$ Interface;" Aug. 14, 2008; 9 pages.

MEMSIC Corporation; MMC314xMS; "Ultra Small 3-axis Magnetic Sensor, with $I^2C$ Interface;" Mar. 31, 2010; 8 pages.

Micronas GmbH; "HAL® 3625 Programmable Direct Angle Sensor;" Product Information; Sep. 2009; 2 pages.

Drljaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.

PCT Search Report and Written Opinion of the ISA; dated May 21, 2013; for PCT Pat. App. No. PCT/US2012/052639; 25 pages.

Melexis MLX 90324; ""Under-the-Hood" Triaxis Rotary Position feat. SENT Protocol;" 3901090324 Data Sheet; Dec. 2008; 40 pages.

PCT Search Report and Written Opinion of the ISA; dated Sep. 6, 2013; for PCT Pat. App. No. PCT/US2012/024426; 11 pages.

Final Office Action dated Oct. 30, 2013; for U.S. Appl. No. 13/035,257; 21 pages.

PCT Search Report and Written Opinion; dated Nov. 26, 2012; for PCT Pat. App. No. PCT/US2012/034892; 13 pages.

Notice of Allowance dated Mar. 14, 2014; for U.S. Appl. No. 13/035,257; 7 pages.

Response flied Aug. 20, 2013; to Office Action dated Jun. 3, 2013; for U.S. Appl. No. 13/035,257; 13 pages.

PCT Search Report and Written Opinion of the ISA; dated May 7, 2012; for PCT Pat. App. No. PCT/US2012/024426; 12 pages.

Office Action dated Jun. 3, 2013; for U.S. Appl. No. 13/035,257; 25 pages.

PCT International Preliminary Report on Patentability and Written Opinion of the ISA dated Dec. 5, 2013; for PCT Pat. App. PCT/US2012/034892; 10 pages.

Kaufmann et al.; "Novel Coupling Concept for Five-Contact Vertical Hall Devices;" 16th International Solid-State Sensors, Actuators and Microsystems (Transducers) Conference; Jun. 5-9, 2011; 4 sheets.

(56) References Cited

OTHER PUBLICATIONS

PCT International Preliminary Report on Patentability and Written OpinIon of the ISA dated Apr. 10, 2014; for PCT Pat. App. No. PCT/US2012/052639; 19 pages.

Taiwan Office Action dated Feb. 18, 2014; for TW Pat. App. No. 101132371; 7 pages.

Taiwan Office Action (English translation) dated Feb. 18, 2014; for TW Pat. App. No. 101132371; 8 pages.

Letter to Taiwan International Patent & Law Office dated Apr. 28, 2014; for Taiwan Pat. App. No. 101132371; 3 pages.

Email from Taiwan International Patent & Law Office dated May 16, 2014; for Taiwan Pat. App. No. 101132371; 2 pages.

Taiwan Response to Office Action (with claims in Taiwanese) filed May 16, 2015; for Taiwan Pat. App. No. 101132371; 14 pages.

Taiwan Claims (English translation) as filed with Response to Office Action filed May 16, 2014; for Taiwan Pat. App. No. 101132371; 12 pages.

Banjevic; "High Bandwidth CMOS Magnetic Sensors Based on the Miniaturized Circular Vertical Hall Device;" Sep. 2011; 153 pages.

* cited by examiner

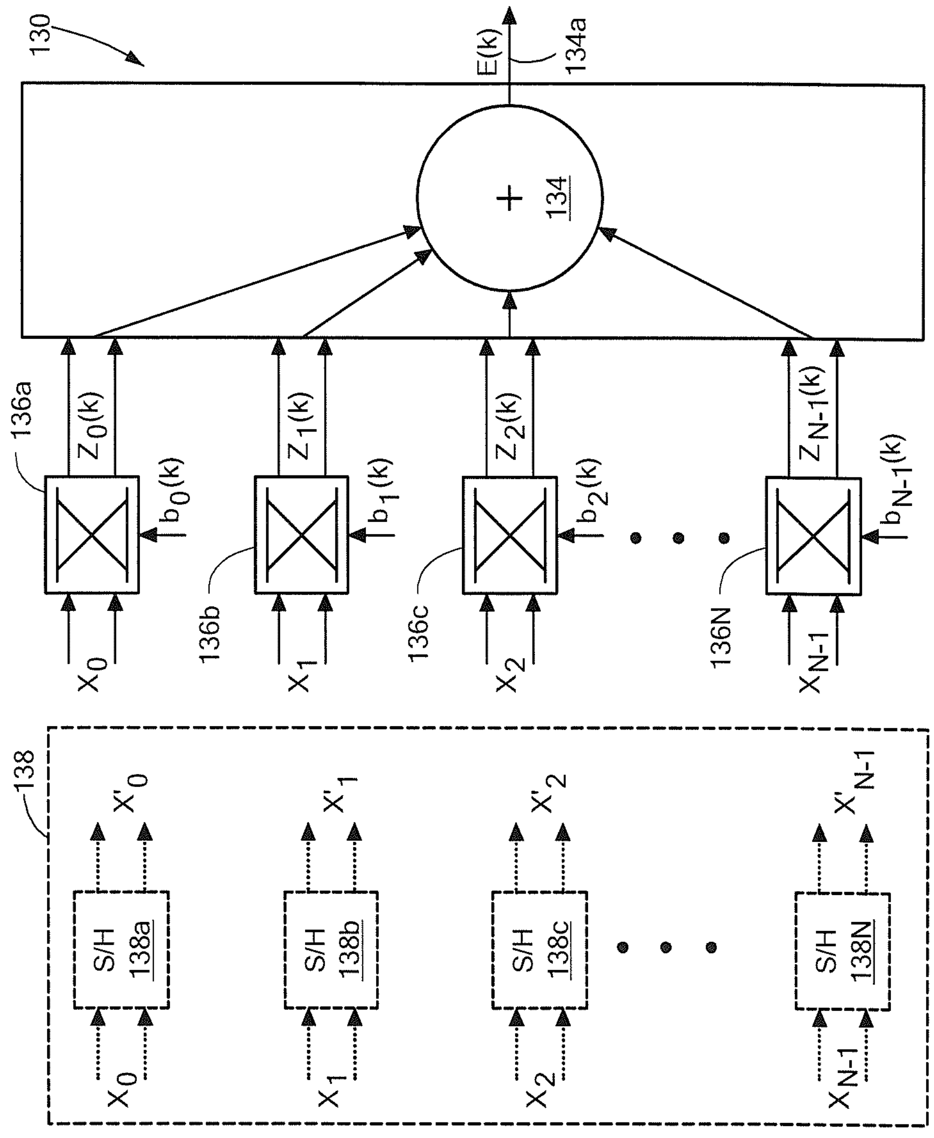
FIG. 7
FIG. 7A
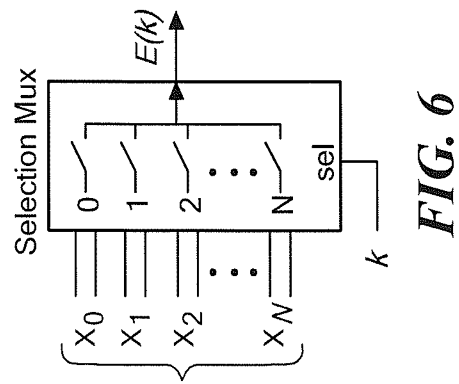
FIG. 6

CIRCUITS AND METHODS FOR PROCESSING A SIGNAL GENERATED BY A PLURALITY OF MEASURING DEVICES

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits, and, more particularly, to an electronic circuit that can rapidly identify an angle of a direction of a sensed parameter sensed by a plurality of measuring devices.

BACKGROUND OF THE INVENTION

As is known, sensing elements are used in a variety of applications to sense characteristics of an environment. Sensing elements include, but are not limited to, pressure sensing elements, temperature sensing elements, light sensing elements, acoustic sensing elements, and magnetic field sensing elements.

A magnetic field sensor can include one or more magnetic field sensing elements and also other electronics.

Magnetic field sensors can be used in a variety of applications. In one application, a magnetic field sensor can be used to detect a direction of a magnetic field. In another application, a magnetic field sensor can be used to sense an electrical current. One type of current sensor uses a Hall effect magnetic field sensing element in proximity to a current-carrying conductor.

Planar Hall elements and vertical Hall elements are known types of magnetic field sensing elements that can be used in magnetic field sensors. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (and optionally a strength) of a magnetic field in a plane of the substrate.

Conventionally, all of the output signals from the plurality of vertical Hall elements within the CVH sensing element are needed in order to determine a direction of a magnetic field. Also conventionally, output signals from the vertical Hall elements of a CVH sensing element are generated sequentially, resulting in a substantial amount of time necessary to generate all of the output signals from the CVH sensing element. Thus, determination of the direction of the magnetic field can take a substantial amount of time.

Various parameters characterize the performance of sensing elements (and sensors that use sensing elements) in general, and magnetic field sensing elements (and magnetic field sensors) in particular. Taking a magnetic field sensing element as an example, these parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field. Other types of sensing elements can also have an offset of a respective output signal that is not representative of a zero sensed characteristic when the sensing element experiences the zero sensed characteristic.

Another parameter that can characterize the performance of a sensor (e.g., magnetic field sensor) is the speed with which output signals from associated sensing elements (e.g., magnetic field sensing elements) can be sampled.

Magnetic field sensors can be used to identify a direction of a magnetic field. For example, in one application, a magnetic field sensor can be used to identify a rotation speed of a target object upon which a magnet is disposed. The magnetic field sensor may have a limit as to how rapidly the magnetic field sensor can identify the direction of the magnetic field, and thus, may have a limit as to how rapidly the target object can rotate and be properly sensed by the magnetic field sensor. Particularly for magnetic field sensors that use a plurality of magnetic field sensing elements (e.g., a CVH sensing element), which are scanned sequentially, the limitation of the magnetic field sensor may be unacceptable.

Thus, it would be desirable to provide a magnetic field sensor that can more rapidly identify a direction of a magnetic field. More generally, it would be desirable to provide a circuit that can more rapidly identify an angle of a direction of a sensed parameter sensed by a plurality of measuring devices.

SUMMARY OF THE INVENTION

The present invention provides a magnetic field sensor that can more rapidly identify a direction of a magnetic field. This is particularly useful for magnetic field sensor embodiments that employ a plurality of magnetic field sensing elements.

More generally, the present invention provides a circuit that can more rapidly identify an angle of a direction of a sensed parameter sensed by the plurality of sensing elements. In some embodiments, the sensed parameter is a magnetic field and the sensing elements are magnetic field sensors. However, in other embodiments, the sensing elements are another type of sensing element, for example, acoustic sensing elements, and the sensed parameter is another type of sensed parameter, for example, and acoustic sound pressure.

In accordance with one aspect of the present invention, an electronic circuit includes a plurality of measuring devices to generate a corresponding plurality measuring device signals. Each one of the plurality of measuring device signals has a respective magnitude related to an angle of a direction of a sensed parameter. The electronic circuit also includes a preprocessing circuit coupled to receive a signal representative of the plurality of measuring device signals, coupled to receive an index value identifying a selection of one or more measuring devices from among the plurality of measuring devices, and configured to generate either a first preprocessed output signal representative of a selected one or more of the plurality of measuring device signals selected in accordance with the index value or a second preprocessed output signal representative of a sum of a selected set of signals representative of the plurality of measuring device signals selected in accordance with the index value. The electronic circuit also includes a post processing circuit coupled to receive the first or the second preprocessed output signal and configured to relate a crossing of a predetermined value of the first or the second preprocessed output signal to the index value. The crossing of the predetermined value is representative of the angle of the direction of the sensed parameter. The post processing circuit includes an analog-to-digital converter coupled to receive a signal representative of the first or the second preprocessed output signal and configured to generate a digital converted signal. The digital converted signal corresponds to the index value.

In some embodiments of the circuit, the plurality of measuring devices corresponds to a plurality of magnetic field sensing elements and the sensed parameter corresponds to a magnetic field.

In accordance with another aspect of the present invention, a method of processing a plurality of measuring device signals generated by a plurality of measuring devices includes receiving a signal representative of the plurality measuring device signals. Each one of the plurality of measuring device signals has a respective magnitude related to an angle of a direction of a sensed parameter. The method also includes receiving an index value identifying a selection of one or more measuring devices from among the plurality of measuring devices. The method also includes generating either a first preprocessed output signal representative of a selected one or more of the plurality of measuring device signals selected in accordance with the index value or a second preprocessed output signal representative of a sum of a selected set of signals representative of the plurality of measuring device signals selected in accordance with the index value. The method also includes relating a crossing of a predetermined value of the first or the second preprocessed output signal to the index value. The crossing of a predetermined value is representative of the angle of the direction of the sensed parameter. The relating includes converting a signal representative of the first or the second preprocessed output signal with an analog-to-digital converter to generate a digital converted signal. The digital converted signal corresponds to the index value. The relating also includes feeding back the index value to the step of receiving the index value.

In some embodiments of the method, the plurality of measuring devices corresponds to a plurality of magnetic field sensing elements and the sensed parameter corresponds to a magnetic field.

BRIEF DESCRIPTION OF THE DRAWINGS

The foregoing features of the invention, as well as the invention itself may be more fully understood from the following detailed description of the drawings, in which:

FIG. 6 is a block diagram of an exemplary switching circuit that can be used as part of the preprocessing circuit of FIG. 3;

FIG. 7 is a block diagram of exemplary switching circuits that can be used as part of the preprocessing circuit of FIG. 3;

FIG. 7A is a block diagram of optional sample and hold circuits that can be used in conjunction with the switching circuits of FIG. 7;

DETAILED DESCRIPTION OF THE INVENTION

Figure 1:
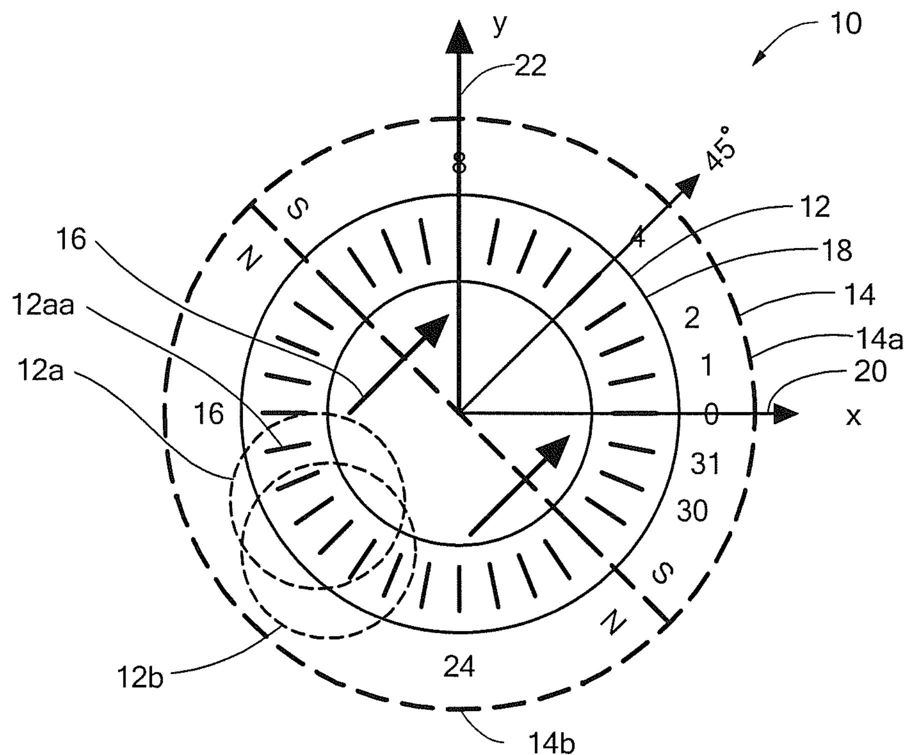
FIG. 1 is a pictorial showing a circular vertical Hall (CVH) sensing element having a plurality of vertical Hall elements arranged in a circle over a common implant region and a two pole magnet disposed close to the CVH sensing element.

Before describing the present invention, some introductory concepts and terminology are explained. As used herein, the term "sensing element" is used to describe a variety of types of electronic elements that can sense a characteristic of the environment. For example, sensing elements include, but are not limited to, pressure sensing elements, temperature sensing elements, motion sensing elements, light sensing elements, acoustic sensing elements, and magnetic field sensing elements.

As used herein, the term "sensor" is used to describe a circuit or assembly that includes a sensing element and other components. In particular, as used herein, the term "magnetic field sensor" is used to describe a circuit or assembly that includes a magnetic field sensing element and electronics coupled to the magnetic field sensing element.

As used herein, the term "measuring device" is used to describe either a sensing element or a sensor. For example, a magnetic field measuring device can be either a magnetic field sensing element or a magnetic field sensor. A measuring device is any device that can measure a parameter of the environment.

As used herein, the term "magnetic field sensing element" is used to describe a variety of electronic elements that can sense a magnetic field. The magnetic field sensing elements can be, but are not limited to, Hall effect elements, magnetoresistance elements, or magnetotransistors. As is known, there are different types of Hall effect elements, for example, a planar Hall element, a vertical Hall element, and a circular Hall element. As is also known, there are different types of magnetoresistance elements, for example, a giant magnetoresistance (GMR) element, an anisotropic magnetoresistance element (AMR), a tunneling magnetoresistance (TMR) element, an Indium antimonide (InSb) sensor, and a magnetic tunnel junction (MTJ).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while magnetoresistance elements and vertical Hall elements (including circular vertical Hall (CVH) sensing elements) tend to have axes of sensitivity parallel to a substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

While a circular vertical Hall (CVH) magnetic field sensing element, which has a plurality of vertical Hall magnetic field sensing elements, is described in examples below, it should be appreciated that the same or similar techniques and circuits apply to any type of sensing elements and to any type of sensors, i.e., to any type of measuring devices.

Referring to FIG. 1, a circular vertical Hall (CVH) sensing element 12 includes a circular implant region 18 having a plurality of vertical Hall elements disposed thereon, of which a vertical Hall element 12*a* is but one example. Each vertical Hall element has a plurality of Hall element contacts (e.g., four or five contacts), of which a vertical Hall element contact 12*aa* is but one example.

A particular vertical Hall element (e.g., 12*a*) within the CVH sensing element 12, which, for example, can have five adjacent contacts, can share some, for example, four, of the five contacts with a next vertical Hall element (e.g., 12*b*). Thus, a next vertical Hall element can be shifted by one contact from a prior vertical Hall element. For such shifts by one contact, it will be understood that the number of vertical Hall elements is equal to the number of vertical Hall element contacts, e.g., 32. However, it will also be understood that a next vertical Hall element can be shifted by more than one contact from the prior vertical Hall element, in which case, there are fewer vertical Hall elements than there are vertical Hall element contacts in the CVH sensing element.

A center of a vertical Hall element 0 is positioned along an x-axis 20 and a center of vertical Hall element 8 is positioned along a y-axis 22. In the exemplary CVH 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a south side 14*a* and a north side 14*b* can be disposed over the CVH 12. The circular magnet 14 tends to generate a magnetic field 16 having a direction from the north side 14*a* to the south side 14*b*, here shown to be pointed to a direction of about forty-five degrees relative to x-axis 20. Other magnets having other shapes and configurations are possible.

In some applications, the circular magnet 14 is mechanically coupled to a rotating object (a target object), for example, an automobile crank shaft or an automobile camshaft, and is subject to rotation relative to the CVH sensing element 12. With this arrangement, the CVH sensing element 12 in combination with an electronic circuit described below can generate a signal related to the angle of rotation of the magnet 14.

Figure 1A:
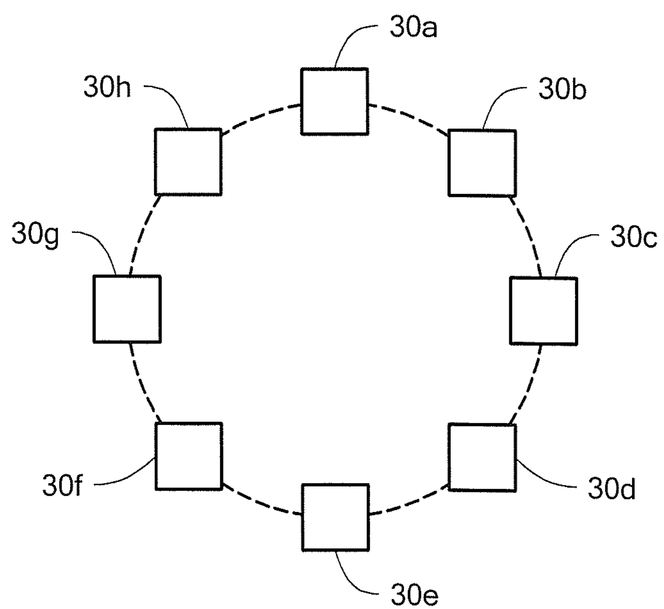
FIG. 1A is a pictorial showing a plurality of sensing elements (or alternatively, sensors), for example, Hall elements, planar or vertical.

Referring now to FIG. 1A, a plurality of sensing elements 30*a*-30*h* (or alternatively, sensors), in a general case, can be any type of sensing elements, including, but not limited to, pressure sensing elements, temperature sensing elements, light sensing elements, acoustic sensing elements, and magnetic field sensing elements. The magnetic field sensing elements 30*a*-30*h* can be, for example, planar Hall elements, vertical Hall elements, or magnetoresistance elements. These elements can also be coupled to an electronic circuit described below. For embodiments where the sensing elements 30*a*-30*h* are vertical Hall elements, there can also be a magnet the same as or similar to the magnet 14 of FIG. 1, disposed proximate to the sensing elements 30*a*-30*h*.

While the sensing elements 30*a*-30*h* are shown to be arranged in a circle, in some embodiments, the sensing elements 30*a*-30*h* can be arranged in another configuration, for example, in a line. Where the sensing elements 30*a*-30*h* are magnetic field sensing elements, such a linear arrangement can be used, for example, to detect a linear position of a ferromagnetic object. Where the sensing elements 30*a*-30*h* are acoustic sensors, such a linear arrangement can be used, for example, to characterize a position of a sound wave along a line.

Figure 2:
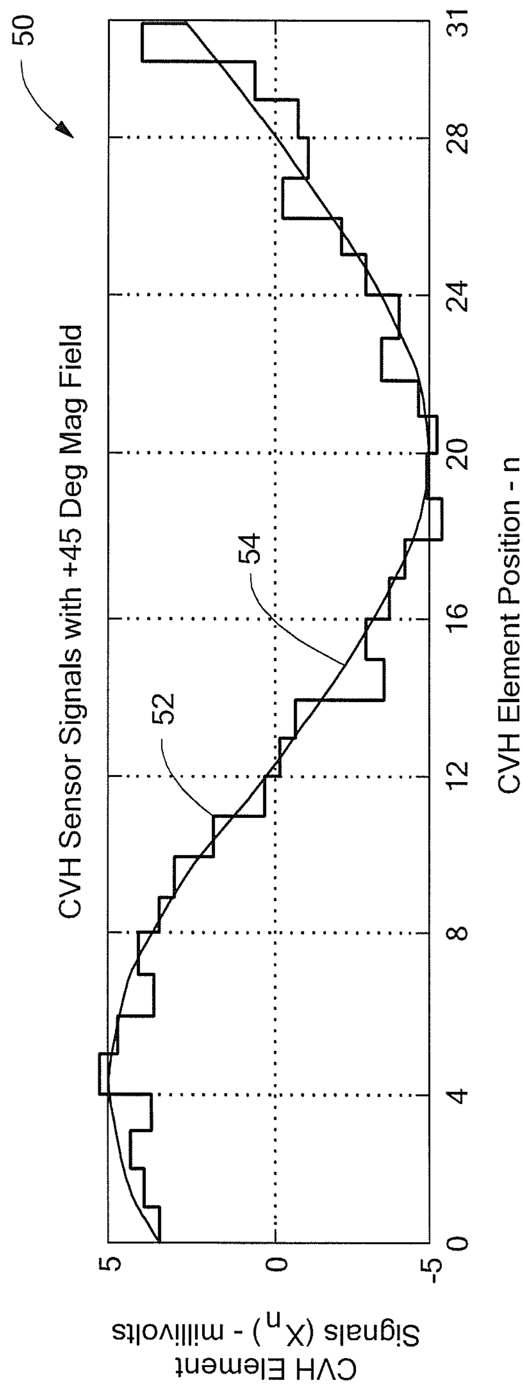
FIG. 2 is a graph showing an output signal as may be generated by the CVH sensing element of FIG. 1 or by the sensing elements of FIG. 1A.

Referring now to FIG. 2, a graph 50 has a horizontal axis with a scale in units of CVH vertical Hall element position, n, around a CVH sensing element, for example, the CVH sensing element 12 of FIG. 1. The graph 50 also has a vertical axis with a scale in amplitude in units of millivolts. The vertical axis is representative of output signal levels from the plurality of vertical Hall elements of the CVH sensing element.

The graph 50 includes a signal 52 representative of output signal levels from the plurality of vertical Hall elements of the CVH taken sequentially with the magnetic field of FIG. 1 stationary and pointing in a direction of forty-five degrees.

Referring briefly to FIG. 1, as described above, vertical Hall element 0 is centered along the x-axis 20 and vertical Hall element 8 is centered along the y-axis 22. In the exemplary CVH sensing element 12, there are thirty-two vertical Hall element contacts and a corresponding thirty-two vertical Hall elements, each vertical Hall element having a plurality of vertical Hall element contacts, for example, five contacts.

In FIG. 2, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show the ideal behavior of the signal 52. The signal 52 has variations due to vertical Hall element offsets, which tend to somewhat randomly cause element output signals to be too high or too low relative to the sine wave 54, in accordance with offset errors for each element. The offset signal errors are undesirable. In some embodiments, the offset errors can be reduced by "chopping" each vertical Hall element. Chopping will be understood to be a process by which vertical Hall element contacts of each vertical Hall element are driven in different configurations and signals are received from different ones of the vertical Hall element contacts of each vertical Hall element to generate a plurality of output signals from each vertical Hall element. The plurality of signals can be arithmetically processed (e.g., summed or otherwise averaged) resulting in a signal with less offset.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

As will be understood from PCT Patent Application No. PCT/EP2008/056517, groups of contacts of each vertical Hall element can be used in a multiplexed or chopped arrangement to generate chopped output signals from each vertical Hall element. Thereafter, or in parallel (i.e., at the same time), a new group of adjacent vertical Hall element contacts can be selected (i.e., a new vertical Hall element), which can be offset by one or more elements from the prior group. The new group can be used in the multiplexed or chopped arrangement to generate another chopped output signal from the next group, and so on.

Each step of the signal 52 can be representative of a chopped output signal from one respective group of vertical Hall element contacts, i.e., from one respective vertical Hall element. However, in other embodiments, no chopping is performed and each step of the signal 52 is representative of an unchopped output signal from one respective group of vertical Hall element contacts, i.e., from one respective vertical Hall element. Thus, the graph 52 is representative of a CVH output signal with or without the above-described grouping and chopping of vertical Hall elements.

It will be understood that, using techniques described above in PCT Patent Application No. PCT/EP2008/056517, a phase of the signal 52 (e.g., a phase of the signal 54) can be found and can be used to identify the pointing direction of the magnetic field 16 of FIG. 1 relative to the CVH sensing element 12.

Figure 3:
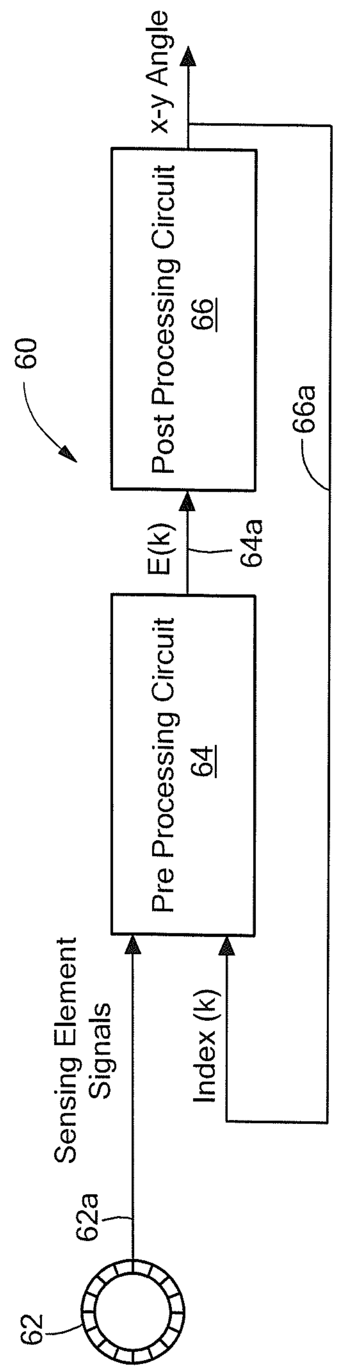
FIG. 3 is a block diagram showing a circuit having a preprocessing circuit coupled to a CVH sensing element and coupled to provide a preprocessed signal to a post processing circuit.

Referring now to FIG. 3, a magnetic field sensor 60 includes a CVH sensing element 62 configured to generate one or more magnetic field sensing element signals 62*a*. A preprocessing circuit 64 is coupled to receive the one or more magnetic field sensing element signals 62*a*, coupled to receive an index value signal 66*a*, and configured to generate a preprocessed signal 64*a*, also referred to herein as a signal, E(k), which is a function of the index value signal 66*a*. A post processing circuit 66 is coupled to receive the preprocessed signal 64*a* and configured to generate a post processed signal 66*a* corresponding to the index value signal 66*a*, and also corresponding to a x-y angle signal representative of a detected pointing direction (angle) of a magnetic field in an x-y plane in which the CVH sensing element 62 lies.

In operation, as will become apparent from discussion below, for a stationary, non-rotating magnetic field, the circuit 60 tends to generate a magnetic field sensing element signal 62*a* having samples from one vertical Hall element within the CVH sensing element 62, corresponding samples within the preprocessed signal 64*a*, and one index value within the index value signal 66*a*, all without continually scanning all of the plurality of vertical Hall elements within the CVH sensing element 62. The value of the index value signal 66*a* is indicative of a pointing direction of the sensed magnetic field. However, the index value signal 66*a* may alternate between two or more values due, for example, to noise or to the method for updating k used in the post processing circuit. A faster detection of the angle of the magnetic field results than that which would be achieved by generating all of the vertical Hall element samples of FIG. 2.

In operation, for a rotating magnetic field, the circuit 60 tends to generate a magnetic field sensing element signal 62*a* having sequential samples from sequential vertical Hall elements within the CVH sensing element 62, corresponding sequential samples within the preprocessed signal 64*a*, and sequential index values within the index value signal 66*a*, but all without continually scanning all of the plurality of vertical Hall elements within the CVH sensing element.

Figure 4:
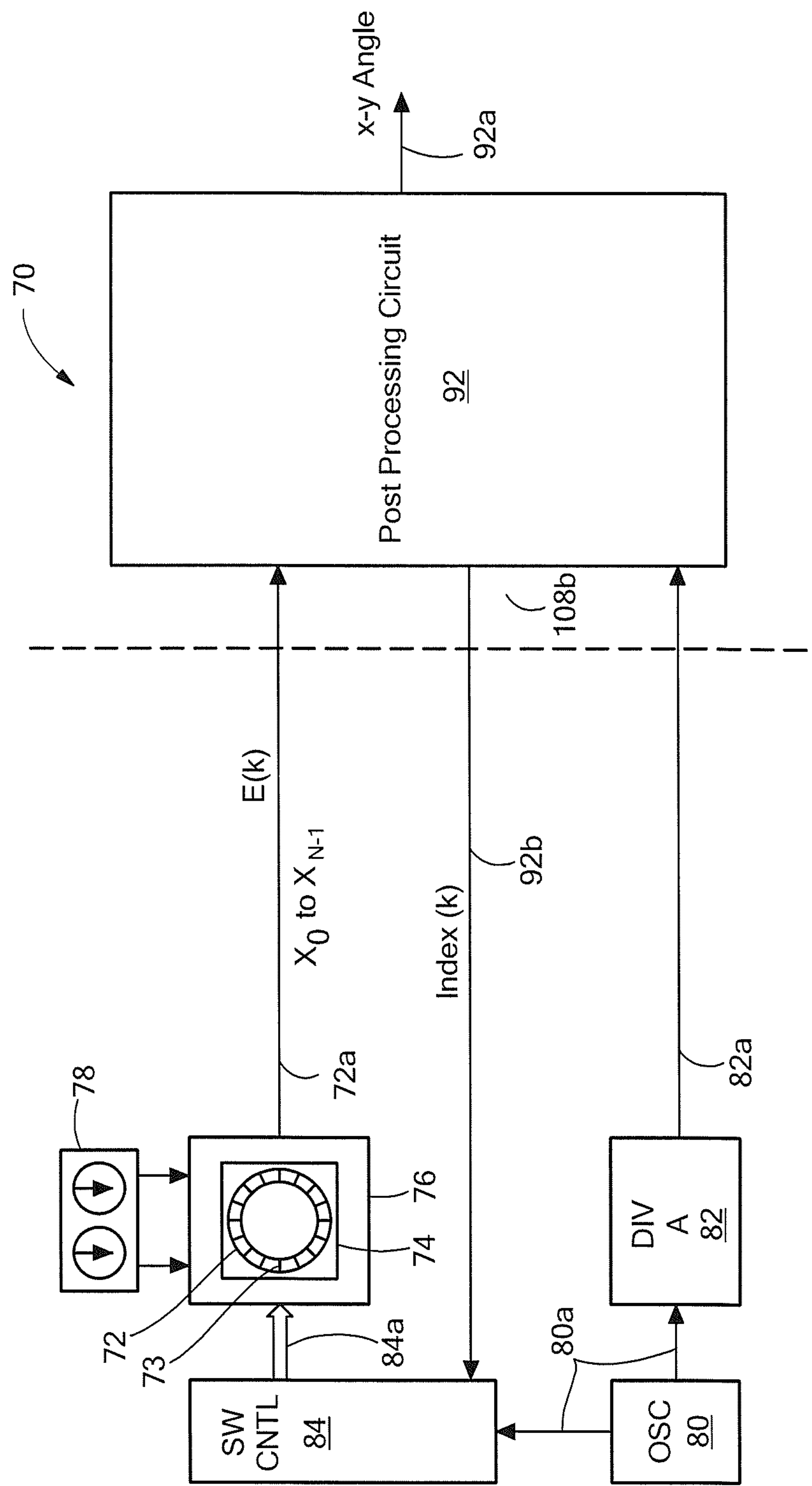
FIG. 4 is a block diagram showing further details of an exemplary preprocessing circuit that can be used in the circuit of FIG. 3.

Referring now to FIG. 4, an exemplary preprocessing circuit can be the same as or similar to the preprocessing circuit 64 of FIG. 3. The preprocessing circuit includes an oscillator 80 configured to generate a clock signal 80*a* having a first frequency. A divider 82 is coupled to receive the clock signal 80*a* and configured to generate a divided clock signal 82*a* having a second frequency less than the first frequency.

The preprocessing circuit can also include a switch control circuit coupled to receive the clock signal 80*a* and configured to generate switch control signals 84*a*. A switching circuit 74 can be coupled to receive the switch control signals 84*a*, coupled to receive an index value signal 92*b*, and configured to select, in accordance with one or more index values of the index value signal 92*b*, one or more corresponding ones of vertical Hall elements 73 of a CVH sensing element 72 for processing.

In some embodiments, there are thirty two possible values of the index value signal 92*a* and there are thirty-two vertical Hall elements within the CVH sensing element 72. However, in other embodiments, there can be more than or fewer than thirty two of each. In some embodiments, the number of possible values of the index value signal 92*a* is less than the number of vertical Hall elements.

In some embodiments, the preprocessing circuit also includes another switching circuit 76 also coupled to receive the switch control signals 84*a*. The switching circuit 76 can perform the above-describe chopping of the vertical Hall elements within the CVH sensing element 72.

Essentially, the clock signal 80*a* operates the switch control circuit 84 with a higher frequency clock than the divided clock operates a post processing circuit 92 for embodiments that use chopping. If chopping is not used, the switching circuit 76 and the divider 82 can be omitted, in which case, the switch control circuit 84 and the post processing circuit 92 can operate with the same clock signal at the same rate.

The preprocessing circuit also includes a drive source 78, for example, two current sources, used to drive the one or more vertical Hall elements selected by the index value signal 92*a*. A combination of current sources and voltage sources can be used in the drive source, driving a single Hall element or multiple Hall elements simultaneously.

As described above in conjunction with FIG. 3, the post processing circuit 92 is coupled to receive magnetic field sensing element signal samples 72*a* from one or more magnetic field sensing elements of the CVH sensing element 72 via the switching circuits 74, 76 and configured to generate the index value signal 92*a* having one or more index values. The post processing circuit is also configured to generate and x-y angle signal 108*a*, which can be the same as the index value 108*b*, but which is shown here to be separate for clarity. As described above in conjunction with FIG. 3, the x-y angle signal 108*a* is representative of an angle of a magnetic field in an x-y plane in which the CVH sensing element is disposed.

Figure 5:
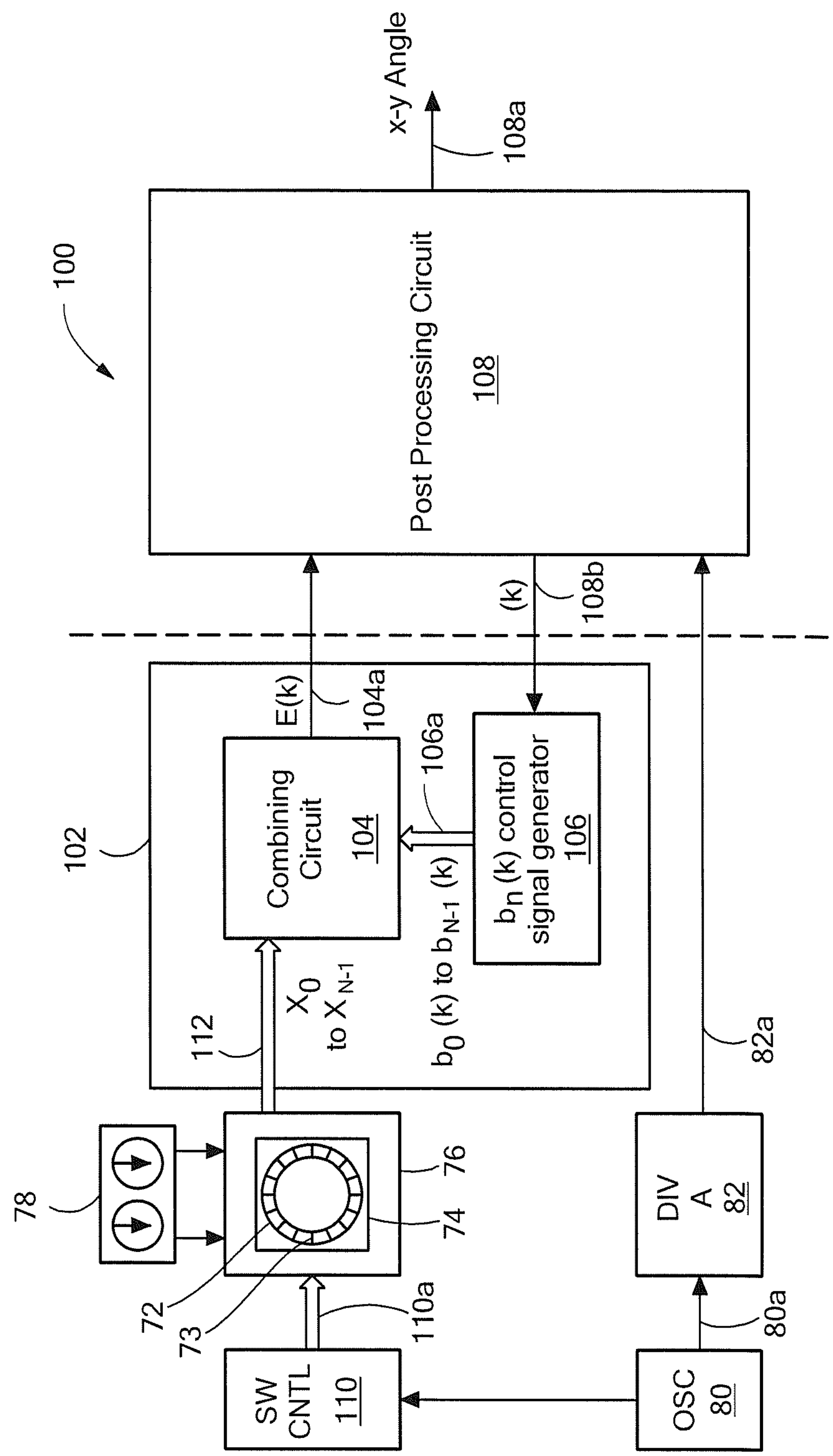
FIG. 5 is a block diagram showing further details of another exemplary preprocessing circuit that can be used in the circuit of FIG. 3.

Referring now to FIG. 5, in which like elements of FIG. 4 are shown having like reference designations, a preprocessing circuit includes another circuit 102 is disposed as shown between the switching circuits 74, 76 and a post processing circuit 108.

The circuit 102 includes a combining circuit 104 coupled to receive magnetic field sensing element signal samples 112 from a plurality of magnetic field sensing elements of the CVH sensing element 72 (either in parallel or sequentially) via the switching circuits 74, 76 and configured to generate the index value signal 92*a* having one or more index values. A similar combining circuit is shown and described in U.S. patent application Ser. No. 13/035,257, entitled "Circuit and Method for Processing Signals Generated by a Plurality of Sensors," filed on Feb. 25, 2011.

In some embodiments, the magnetic field sensing element signal samples 112 from the plurality of magnetic field sensing elements of the CVH sensing element 72 are generated at the same time, i.e., in parallel. Such an arrangement is shown and described in U.S. patent application Ser. No. 13/035,243, entitled "Circular Vertical Hall Magnetic Field Sensing Element and Method with a Plurality of Continuous Output Signals," filed on Feb. 25, 2011. However, in other embodiments, the magnetic field sensing element signal samples 112 from the plurality of magnetic field sensing elements of the CVH sensing element 72 are generated sequentially, as describe, for example, in PCT Patent Application No. PCT/EP2008/056517.

The post processing circuit 108 is coupled to receive a preprocessed signal 104*a* from the combining circuit 104

The combining circuit 104 can also be coupled to receive $b_n(k)$ control signals 106*a* generated by a $b_n(k)$ control signal generator 106. The $b_n(k)$ control signal generator 106 is coupled to receive an index value signal 108*b* generated by the post processing circuit 108.

The post processing circuit 108 is also configured to generate an x-y angle signal 108*a* that can be the same as or similar to the x-y angle signal 92*a* of FIG. 4. The x-y angle signal; 108*a* and the index value signal 108*b* can be the same signal but are shown here to be separate signals for clarity.

Operation of the circuit 102 is more fully described below. However, let it suffice here to say that the combining circuit 104 takes in a plurality of signal samples in the magnetic field sensing element signal samples 112, and combines them in order to generate one (or more) sample in the preprocessed output signal 104*a*.

Referring now to FIG. 6, a switching circuit can be the same as or similar to the switching circuit 74 of FIG. 4, which is used to select one of the signals $x_0$ to $x_N$ generated by N vertical Hall elements within the CVH sensing element 72 in response to a value, k of the index value signal 92*b*.

Referring now to FIG. 7, a combining circuit 130 can be the same as or similar to the combining circuit 104 of FIG. 5. The combining circuit 130 can include a plurality of switching circuits 136*a*-136N, each coupled to receive a respective one of the CVH output signals 112, $x_n = x_0$ to $x_{N-1}$, of FIG. 5. The switching circuits 136*a*-136N are also each coupled to receive a respective one of the control signals 106*a*, $b_0(k)$ to $b_{N-1}(k)$, of FIG. 5.

Referring briefly to FIG. 7A, optionally, respective sample and hold circuits 138 can be coupled before the switching circuits 136*a*-136N. The sample and hold circuits 138 can be used for embodiments described above in which the CVH output signals 112 of FIG. 4 are sequentially generated. In these embodiments, sampled signals $x'_0$ to $x'_{N-1}$, sampled sequentially and held, are provided to the switching circuits 136*a*-136N instead of the signals $x_0$ to $x_{N-1}$.

For embodiments also described above, for which the CVH output signals 112 of FIG. 5 are continuously generated, no sample and hold circuits 138 are needed, and signals $x_0$ to $x_{N-1}$ are provided at the same time to the switching circuits 136*a*-136N.

The switching circuits 136*a*-136N generate respective switched signals $z_0(k)$ to $z_{N-1}(k)$ (e.g., 32 switched signals). A summing circuit 134 is coupled to receive the switched signals, $z_0(k)$ to $z_{N-1}(k)$, and configured to generate a combined signal 134*a*, which can be the same as or similar to the preprocessed signal 104*a* of FIG. 5.

In operation, at any particular time, some of the control signals, $b_0(k)$ to $b_{N-1}(k)$, are in a high state and others are in a low state. The switching circuits 136*a*-136N are responsive to respective states of the control signals, $b_0(k)$ to $b_{N-1}(k)$, such that, in response to one particular state of a respective control signal, a respective one of the CVH output signals, $x_0$ to $x_{N-1}$, is inverted as it passes through the respective switching circuit, and in response to the other different state of the control signal, the CVH output signal is not inverted. Outputs signals, $z_0(k)$ to $z_{N-1}(k)$, result, which can be differential signals as shown, or which, in other embodiments, can be signal-ended signals.

It will be appreciated that the combined signal 134*a*, E(k), is essentially a sum of signals, i.e., a sum of some of the CVH output signals, $x_0$ to $x_{N-1}$, that are inverted along with some of the CVH output signals, $x_0$ to $x_{N-1}$, that are not inverted.

In operation, the control signals, $b_0(k)$ to $b_{N-1}(k)$, change state from time to time. Changes of the control signals, $b_0(k)$ to $b_{N-1}(k)$, are more fully described below in conjunction with FIG. 8.

Figure 8:
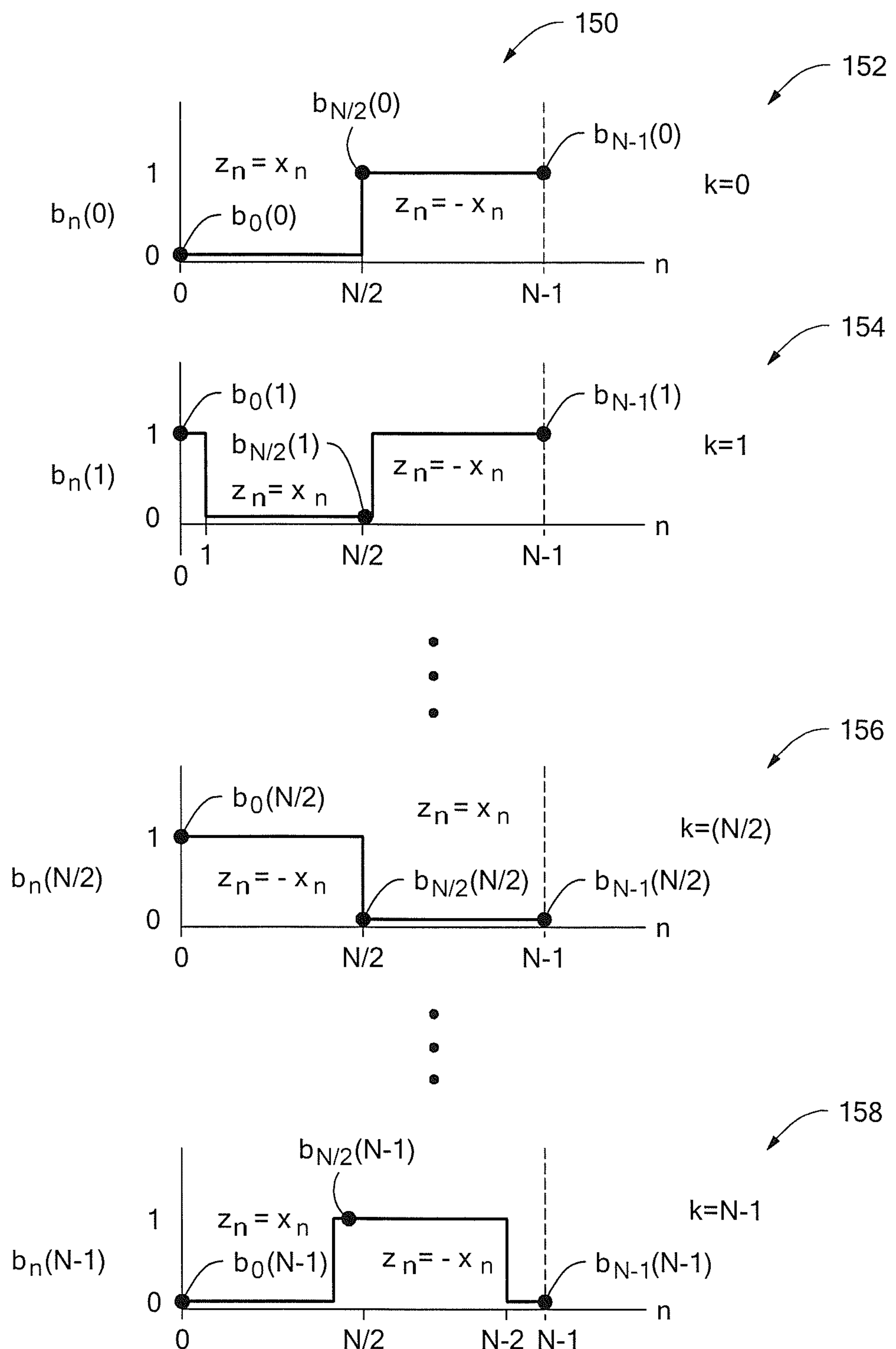
FIG. 8 is a series of graphs showing behavior of exemplary $b_n$ control signals generated by a $b_n$ control signal generator of FIG. 5.

Referring now to FIG. 8, graphs 152-158 each have a horizontal axis with a scale in units of vertical Hall element position around a CVH sensing element, and a vertical axis having a scale in units representative of a binary state (1 (e.g., high) or 0 (e.g., low)) of the $b_n$ control signals, $b_0(k)$ to $b_{N-1}(k)$ of FIG. 7 and the $b_n$ control signals 106*a* of FIG. 5.

As described above, the Hall element positions, N positions, represented by the horizontal axes, can have steps of one vertical Hall element (i.e., one vertical Hall element contact) or steps of more than one vertical Hall element (i.e., more than one vertical Hall element contact). Furthermore, the positions can be indicative of positions of respective groups of Hall elements when used in a chopped arrangement.

Each one of the graphs represents the control signals, $b_0(k)$ to $b_{N-1}(k)$, taken at a different time. For example, the graph 152 shows that, at a first time (or increment 0) of the indexing variable, k, the control signals from $b_0(0)$ to $b_{N/2-1}(0)$ are low and the control signals from $b_{N/2}(0)$ to $b_{N-1}(0)$ are high.

The subscript index is representative of the position, n, of the vertical Hall element (or group of vertical Hall element contacts) around the CVH sensing element, and there are N such positions from 0 to N−1. The index, k, is representative of a time increment associated with a change of the control signals, $b_0(k)$ to $b_{N-1}(k)$.

At the $0^{th}$ increment of the index, k, the control signal $b_0(0)$ is low and is the control signal received by the switching circuit 136*a* of FIG. 7 at a particular time represented by k=0. The low control signal, $b_0(0)$, can cause the switching circuit 136*a* not to invert, resulting in $z_0(0)=x_0(0)$. At the N/2 vertical Hall element position, the control signal, $b_{N/2}(0)$, is high, causing a respective one of the switching circuits of FIG. 7 to invert, resulting in $z_{N/2}(0)=-x_{N/2}(0)$. At the last vertical Hall element position, N−1, the respective control signal, $b_{N-1}(0)$, is high, also causing the switching circuit 136N of FIG. 7 to invert, resulting in $z_{N-1}(0)=-x_{N-1}(0)$.

The graphs 154-158 are representative of one particular embodiment, for which, at each increment of the time index, k, the control signals $b_0(k)$ to $b_{N-1}(k)$ shift by one vertical Hall element position (i.e., by one vertical Hall element contact). Thus, referring to the graph 154, at the $0^{th}$ increment of the index, k, the control signal $b_0(1)$ is now high and is the control signal received by the switching circuit 136*a* of FIG. 7. The high control signal, $b_0(1)$, can cause the switching circuit 136*a* to invert, resulting in $z_0(1)=-x_0(1)$. At the N/2 vertical Hall element position, the control signal, $b_{N/2}(1)$, is now low, causing a respective one of the switching circuits of FIG. 7 not to invert, resulting in $z_{N/2}(1)=x_{N/2}(1)$. At the last vertical Hall element position, N−1, the respective control signal, $b_{N-1}(1)$, is still high, causing the switching circuit 136N of FIG. 7 to invert, resulting in $z_{N-1}(1)=-x_{N-1}(1)$.

Similarly, referring to the graph 156, at the N/2 increment of the index, k, the control signal $b_0(N/2-1)$ is high and is the control signal received by the switching circuit 136*a* of FIG. 7. The high control signal, $b_0(N/2)$, can cause the switching circuit 136*a* to invert, resulting in $z_0(N/2)=-x_0(N/2)$. At the N/2 vertical Hall element position, the control signal, $b_{N/2}(N/2)$, is low, causing a respective one of the switching circuits of FIG. 7 not to invert, resulting in $z_{N/2}(N/2)=x_{N/2}(N/2)$. At the last vertical Hall element position, N−1, the respective control signal, $b_{N-1}(N/2)$, is now low, causing the switching circuit 136N of FIG. 7 not to invert, resulting in $z_{N-1}(N/2)=x_{N-1}(N/2)$.

Finally, referring to the graph 158, at the N−1 increment of the index, k, the control signal $b_0(N-1)$ is now low, causing the switching circuit 136*a* to not invert, resulting in $z_0(N-1)=x_0(N-1)$. At the N/2 vertical Hall element position, the control signal, $b_{N/2}(N-1)$, is now high, causing a respective one of the switching circuits of FIG. 7 to invert, resulting in $z_{N/2}(N-1)=-x_{N/2}(N-1)$. At the last vertical Hall element position, N−1, the respective control signal, $b_{N-1}(N-1)$, is low, causing the switching circuit 136N of FIG. 7 not to invert, resulting in $z_{N-1}(N-1)=x_{N-1}(N-1)$.

While half of the control signals $b_0(k)$ to $b_{N/2-1}(k)$ at any increment of the index, k, are shown to be high and the other half to be low, in other embodiments, other proportions of high and low control signals can be used. This can include proportions all the way down to one control signal being in one state and all of the other control signals being in another state. However, a best signal to noise ratio is obtained when the proportion is one-half.

As used herein, the phrase "approximately half" refers to a range of about forty percent to about sixty percent.

Figure 9:
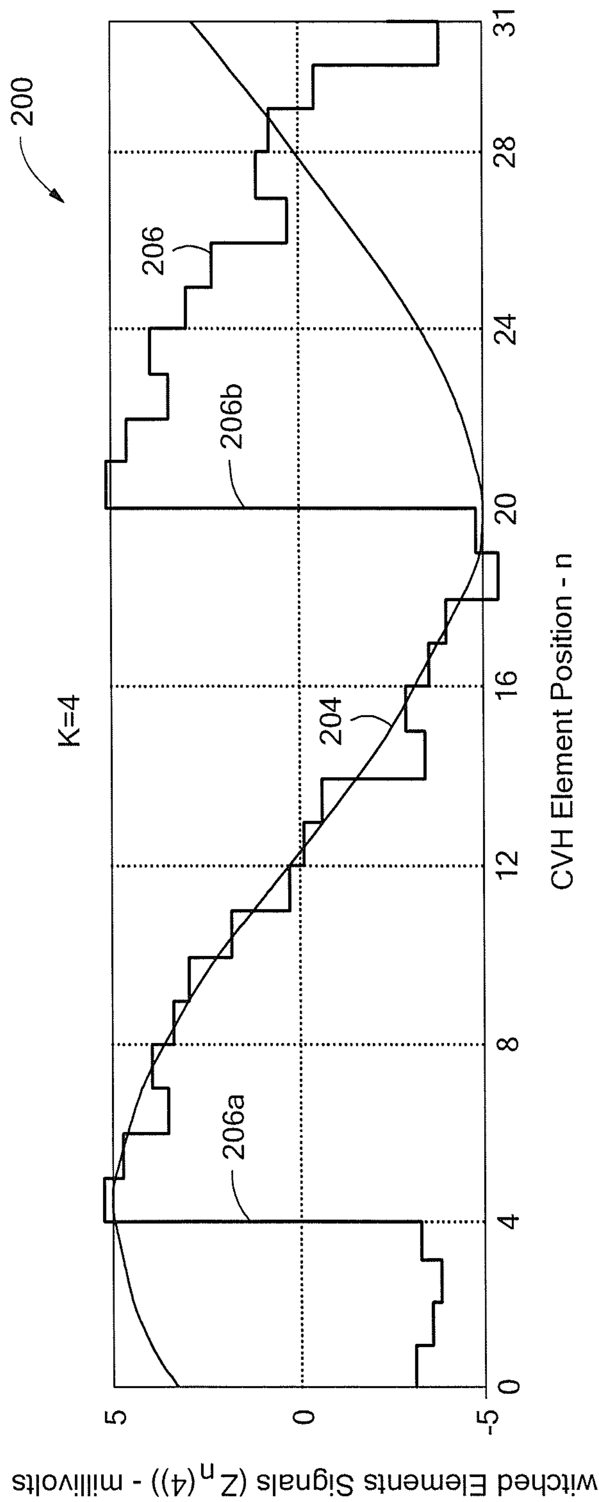
FIG. 9 is a graph showing an exemplary output signal from the switching circuits of FIG. 7 for particular $b_n$ control signals.

Referring now to FIG. 9, a graph 200 includes a horizontal axis with a scale in units of CVH element position, n. The graph 200 also includes a vertical axis with units of magnitude in millivolts. The vertical scale is representative of magnitude of switched element signals $z_0(k)$ to $z_{N-1}(k)$ (see, e.g., FIG. 7) for a k index value of four. While shown in voltage units in millivolts, the magnitude can either be in units of voltage or in units of current, depending upon the type of circuits used. The k index value of four is representative of a particular shift of the $b_n$ control signals (see, e.g., FIG. 8).

For reference only, a sine wave 204 is shown, which is like the sine wave 54 of FIG. 2.

A signal 206 is representative of the switched element signals (e.g., $z_0(4)$ to $z_{N-1}(4)$) from each one of thirty-two vertical Hall element positions within the CVH sensing element, before the signals are combined, for example, by the summing circuit 134 of FIG. 7. Comparing the signal 206 to the signal 52 of FIG. 2, it will be understood that from CVH element position 4 to CVH element position 19, the signal 206 is identical to the signal 52, while from CVH element positions 20 to 31 and positions 0 to 3, the signal 206 is inverted from the signal 52. Transitions 206*a* and 206*b* are apparent.

It will be apparent that if all of the magnitudes (steps) of the signal 206 were summed, e.g., by the summing circuit 134 of FIG. 7, the sum would be near zero.

Figure 9A:
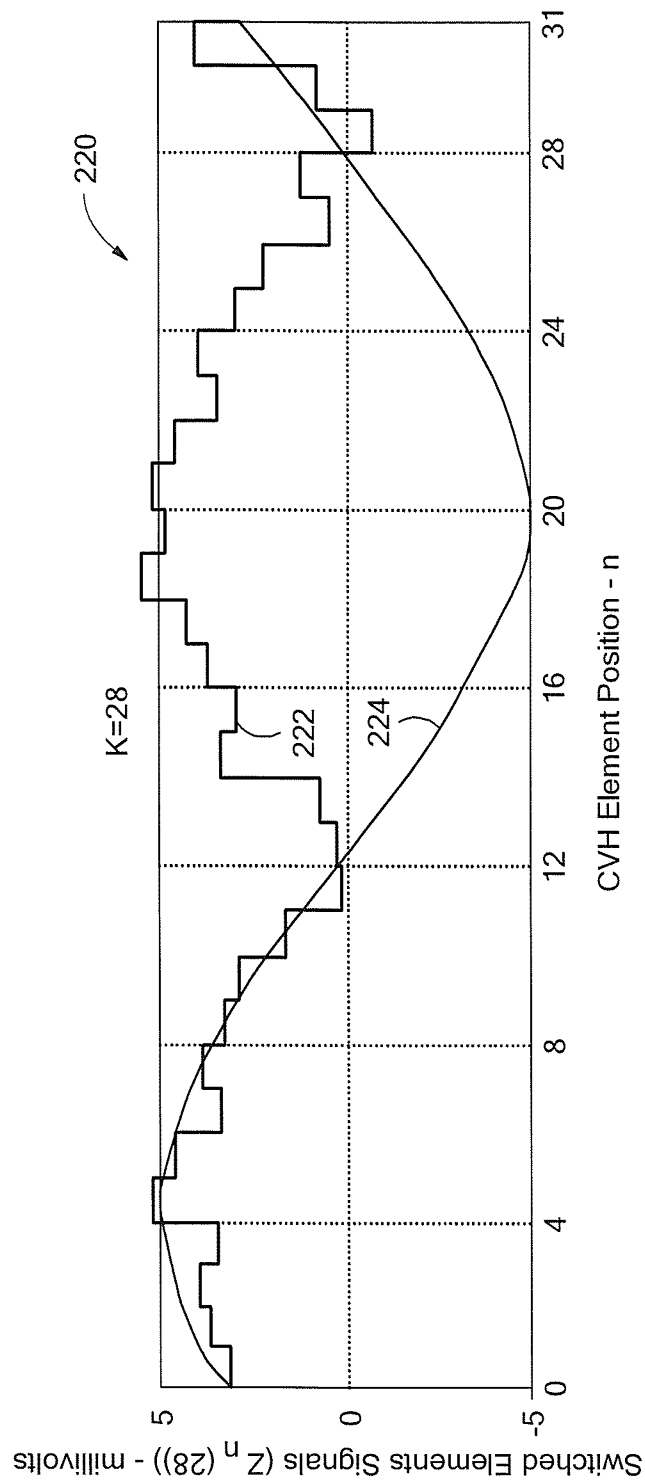
FIG. 9A is a graph showing another exemplary output signal from the switching circuits of FIG. 7 for different $b_n$ control signals.

Referring now to FIG. 9A, a graph 220 includes a horizontal axis with a scale in units of CVH element position, n. The graph 220 also includes a vertical axis with units of magnitude in millivolts. The vertical scale is representative of magnitude of switched element signals $z_0(k)$ to $z_{N-1}(k)$ (see, e.g., FIG. 7) for a k index value of twenty-eight. The k index value of twenty-eight is representative of another particular shift of the $b_n$ control signals (see, e.g., FIG. 8).

For reference only, a sine wave 224 is shown, which is like the sine wave 54 of FIG. 2.

A signal 222 is representative of the switched element signals (e.g., $z_0(28)$ to $z_{N-1}(28)$) from each one of thirty-two vertical Hall element positions within the CVH sensing element, before the signals are combined, for example, by the summing circuit 134 of FIG. 7. Comparing the signal 222 to the signal 52 of FIG. 2, it will be understood that from CVH element position 28 to CVH element position 31 and from positions 0 to 11, the signal 222 is identical to the signal 52, while from element positions 12 to 27, the signal 222 is inverted from the signal 52.

It will be apparent that if all of the magnitudes (steps) of the signal 222 were summed, e.g., by the summing circuit 134 of FIG. 7, the sum would be near to a maximum.

Figure 10:
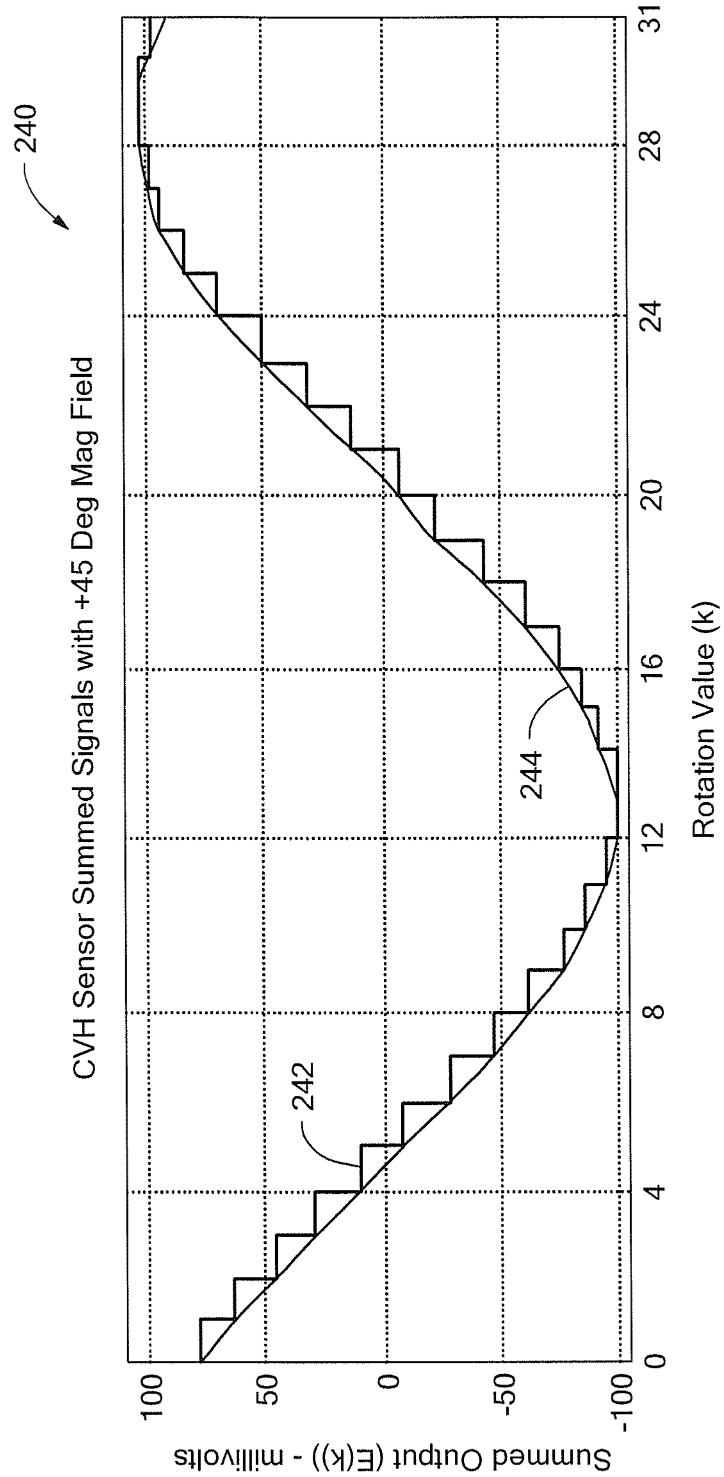
FIG. 10 is a graph showing an exemplary output signal from a combining circuit of FIG. 5.

Referring now to FIG. 10, a graph 240 includes a horizontal axis in units of the index value k. The graph 240 also includes a vertical scale in units of voltage in millivolts. A signal 242 is representative of a summed signal, for example, the preprocessed signal 104*a* of FIG. 5 or the combined signal 134*a* of FIG. 7, for all N possible shifts of the b(n) control signals.

For reference only, a sine wave 244 is shown.

Comparing the signal 242 with the signals 206, 222 of FIGS. 9 and 9A, it can be seen that the signal 242 is near zero when the index value, k, is equal to four (see, e.g., FIG. 9), and the signal 242 is near to a maximum when the index value, k, is equal to twenty-eight (see, e.g., FIG. 9A.

It will be noted that the offset errors in the signals 52, 206, 222 of FIGS. 2, 9, and 9A, which cause voltage deviations from the ideal sine wave from element position to element position, are greatly reduced in the signal 242 of FIG. 10. This is due to the summing provided by the summing circuit 134 of FIG. 7, which tends to average any random offset signals.

Referring briefly to FIG. 2, as described above, the pointing direction of the magnetic field 16 of FIG. 1, forty-five degrees, can be determined according to a maximum of the signal 52 at the CVH element position of four.

Referring again to FIG. 10, the pointing direction of the magnetic field 16 of FIG. 1 can instead be determined according to a zero crossing (or a crossing of another predetermined value) of the signal 242, for example, at the index value, k, of four. Note that there are two zero crossings, one near k=4 and one near k=20. The zero crossing with the negative slope, from positive E(k) to negative E(k), will correspond to the pointing direction of the magnetic field. The signal 242 has less random fluctuation than the signal 52, and thus, the angle measurement should be more accurate.

The magnitude of the signal 242 is shown to be larger than the magnitude of the signal 52 of FIG. 2. The larger magnitude of the signal 242 is expected due to the summation of signals by the summing circuit, for example, by the summing circuit 134 of FIG. 7. The signal 242 can be represented as:

$$E(\theta_{IN}, k) = A\cos\left[\theta_{IN} + \frac{2\pi}{N}\left(k - \frac{1}{2}\right)\right]$$

where:

$\theta_{IN}$=magnetic field angle in plane of CVH sensing element;

k=$b_n$ control signal index; and

A=a constant related to total number of vertical Hall element positions used in the CVH sensing element.

It will be appreciated that the higher amplitude of the signal 242 results in an improved signal to noise ratio.

It will be appreciated from the above equation that $\theta_{IN}$=45° or π/4, k=4.5 gives E($\theta_{IN}$,k)=0, thus the exact location for the zero crossing of E($\theta_{IN}$,k) will be between positions 4 and 5. It will also be appreciated from the above equation that $\theta_{IN}$=45° or π/4, k=28.5 gives E($\theta_{IN}$,k)=2GN/π, or the maximum of E($\theta_{IN}$,k), thus the exact location for the maximum of E($\theta_{IN}$,k) will be between positions 28 and 29. Also note that any angle can be determined from the value of k that results in the first zero crossing of E($\theta_{IN}$,k), which is when the argument of the cosine function is π/2 or 90°. This is determined from the equation:

$$\theta_{IN} = +\frac{\pi}{2} - \frac{2\pi}{N}\left(k - \frac{1}{2}\right)$$

The signal 242 (i.e., the preprocessed signal 104*a* of FIG. 5) can be subsequently processed by the post processing circuit 108 of FIG. 5 to identify one of the values of the signal 242 that crosses a predetermined value, e.g., zero, which is representative of the angle of the magnetic field.

While the circuits and methods described herein are shown by example of vertical Hall elements within a CVH sensing element, as described above, it should be appreciated that the same techniques can be used to process signals from a plurality of any type of sensing element. In some embodiments, the circuits and methods can be used to identify a largest signal from among the plurality of sensing elements. The same benefits of reduced offset signal variations and increased amplitude and processing speed will apply to any type of sensing elements, and not only to magnetic field sensing elements. For example, the same techniques could be applied to a plurality of acoustic sensing elements used to sense an acoustic signal.

It should also be apparent that the same benefits can be achieved in relation to any type of measuring devices, i.e., any type of sensing elements or sensors. For example, the same techniques could be applied to a plurality of magnetic field sensors, each having a magnetic field sensing element and associated processing circuitry.

As described above in conjunction with FIGS. 7 and 7A, the CVH sensing element described herein can be used either in a mode that provides sequential output signals from a plurality of vertical Hall elements or in a mode that can provide simultaneous and continuous output signals from a plurality of vertical Hall elements. A sequential arrangement is described in PCT Patent Application No. PCT/EP2008/056517, which is incorporated by reference above. A continuous arrangement is described in U.S. patent application Ser. No. 13/035,243, entitled "Circular Vertical Hall Magnetic Field Sensing Element and Method With a Plurality of Continuous Output Signals," filed Feb. 25, 2011.

Figure 11:
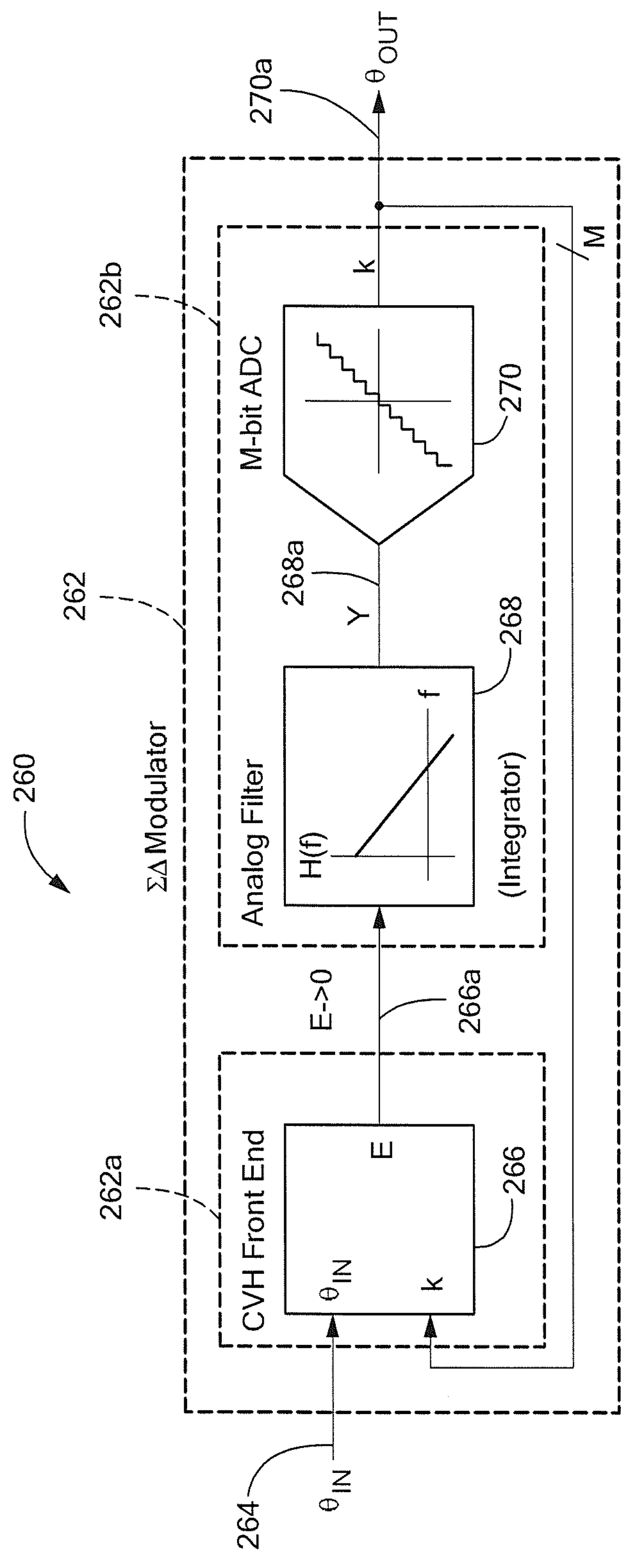
FIG. 11 is a block diagram showing exemplary circuits that can be used to provide the preprocessing circuit and the post processing circuit of FIG. 3.

Referring now to FIG. 11, a circuit 260 includes a preprocessing circuit 262*a* coupled to a post-processing circuit 262*b*. The preprocessing circuit 262*a* can be the same as or similar to any of the preprocessing circuits described above in conjunction with FIG. 3, 4, or 5. Similarly, the post-processing circuit 262*b* can be the same as or similar to either of the post-processing circuits described above in conjunction with FIGS. 3, 4, and 5.

As described above in conjunction with FIG. 3, the preprocessing circuit 262*a* is coupled to receive sensing element signals 264 (or more generally, measuring device signals 264), for example magnetic field sensing element signals, coupled to receive an index value signal 270*a*, and configured to generate a preprocessed signal 266*a*. The post-processing circuit 262*b* is coupled to receive the preprocessed signal 266*a* and configured to generate the index value signal 270*a*.

The preprocessing circuit 262*a* and the post-processing circuit 262*b* are coupled in an arrangement similar to a sigma delta modulator. The post-processing circuit can include, for example, an analog filter 268 (integrator) coupled to receive the preprocessed signal 266*a*, and configured to generate an integrated signal 268*a*. The post processing circuit 262*b* can also include an analog-to-digital converter 270 coupled to receive the integrated signal 268*a* and configured to generate a converted signal 270*a*, which corresponds to the index value signal 270*a* received by the preprocessing circuit 262, and which corresponds to an angle output signal 270*a* (i.e., an x-y angle signal), which can be representative of an angle of a sensed parameter, e.g., an angle of a magnetic field.

In some embodiments, the index value signal 270*a* has M digital bits. However, in some alternate embodiments, the analog-to-digital converter 270 is a comparator, which is a simple form of analog-to-digital converter. In these embodiments, it will be understood that the index value signal 270*a* has only one digital bit. Where the analog-to-digital converter 270 is provided instead as a comparator, it may be desirable to average the resulting index value signal before presenting the index value signal to the CVH front end circuit 262*a* in order to increase resolution. As used herein, the term "analog-to-digital converter" includes a comparator and also any multi-bit analog-to-digital converter.

In some embodiments, the analog filter 268 is a single integrator, which would make the circuit 260 be like a first order sigma-delta converter. However, any number of integrators can be used, thus, the circuit 260 can be like a sigma-delta converter having an order greater than one.

Operation of the circuit 260 is described below in conjunction with FIGS. 11 and 12

Figure 12:
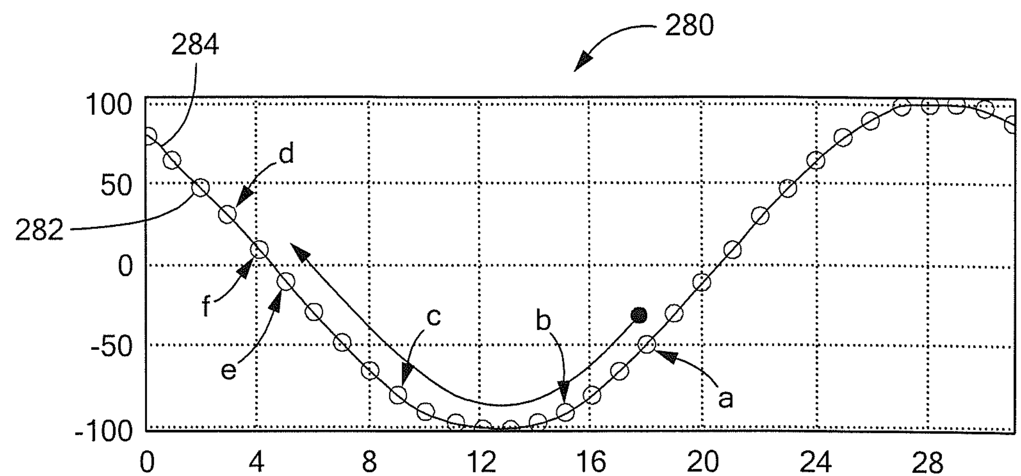
FIG. 12 is a graph showing exemplary output signal data points generated by the circuit of FIG. 11.

Referring now to FIG. 12, a graph 280 has a horizontal axis with a scale in units of values of the index value signal 270*a* of FIG. 11, presuming that the index value signal 270*a* has a five bit range (32 values). It should be understood that each index value corresponds to a selection of a respective one of the vertical Hall elements within a CVH sensing element. The graph 280 also has a vertical axis with a scale in units of amplitude in arbitrary units of the preprocessed signal 266*a* of FIG. 11, for example, in millivolts. The graph 280 includes data points of which a data point 282 is but one example. A sinusoid 284 is included to show an ideal behavior of the data points. Offset voltages are not shown in FIG. 12.

From discussion below, it will be understood that the circuit 260 of FIG. 11, for a stationary magnetic field, does not generate all of the data points shown in FIG. 12 either sequentially or at the same time, i.e., the circuit 260 does not select all of the vertical Hall elements within the CVH sensing element either sequentially or at the same time. Rather, for a stationary magnetic field, the circuit 260 seeks but one of the data points, i.e., one value of the preprocessed output signal 266*a*, i.e. one selected vertical Hall element within the CVH sensing element (or, in accordance with FIGS. 5 and 7-10, one partial inversion and summation of Hall effect elements within the CVH sensing element), and the one data point is indicative of a direction of the magnetic field sensed by the circuit 260. This is further described by example below.

From inspection of the data points, it will be understood that vertical Hall elements number 12 and number 28 are most sensitive to magnetic field (or, in accordance with FIGS. 5 and 7-10, partial inversions and summations with index values 12 and 28). Thus, vertical Hall elements 12 and 28, or rather, lines drawn between vertical Hall element contacts of vertical Hall elements 12 and 28 are nearly perpendicular to the sensed magnetic field. Similarly, vertical Hall elements 4 and 20 are nearly parallel to the magnetic field and produce nearly zero output. In other words, the sensed magnetic field has a pointing direction at forty-five degrees relative to magnetic field sensing element number zero.

The circuit, for example, the circuit 260 of FIG. 11, may or may not include chopping. Similarly the data points of FIG. 12 may or may not be representative of chopping.

The zero crossings in the data points of FIG. 12 represent that there are two average values that can be achieved for the index value signal, i.e., index values, k, namely 4.5 and 20.5, that can be achieved by the circuit 260 for the example of the stationary magnetic field pointing at forty-five degrees. Thus, it appears that the circuit 260 can provide ambiguous results, only one of which is correct, as to the pointing direction of the magnetic field for any stationary magnetic field. However, from discussion below, it will be understood that the circuit 260 will behave to converge toward the index value of 4.5 and diverge from the index value of 20.5

To explain the above ambiguity, suppose that the integrated signal 268*a* of FIG. 11 at a time t=0 is such that the output signal from the analog-to-digital converter 270, i.e. the index value of the index value signal 270*a*, is equal to 18, which corresponds to data point “a” of FIG. 12. At the index value of 18, the preprocessed output signal 266*a* of FIG. 11 is negative. Thus, the integrated signal 268*a* of FIG. 11 trends more negative, which tends to decrease the index value of the index value signal 270*a* of FIG. 11, and which tends to decrease the preprocessed output signal 266*a* and associated data points shown in FIG. 12. Thus, the value of the index value signal 270*a* moves from point “a” toward point “b,” eventually settling to toggle between points “e” and “f.” If the circuit reaches data point “d,” it will trend back to toggle between points “e” and “f.”

Although it appears that the above example converges, convergence to the same final value of the index value signal 270*a* does not occur from every starting point. This is shown and described in conjunction with FIG. 13.

While stationary magnetic fields are described above, it should be understood that, for a rotating magnetic field, a phase of the sinusoid on which the data points lie will tend to rotate in phase. Accordingly, the circuit 260 of FIG. 11, will continually attempt to find new values of the index value signal 270*a* representative of a zero crossing (or a crossing of any desired predetermined value) of the data points. Thus, for a rotating magnetic field, the index value signal 270*a* will continually take on new values, each one representative of an angle of the magnetic field at the time that the data point is generated.

Figure 13:
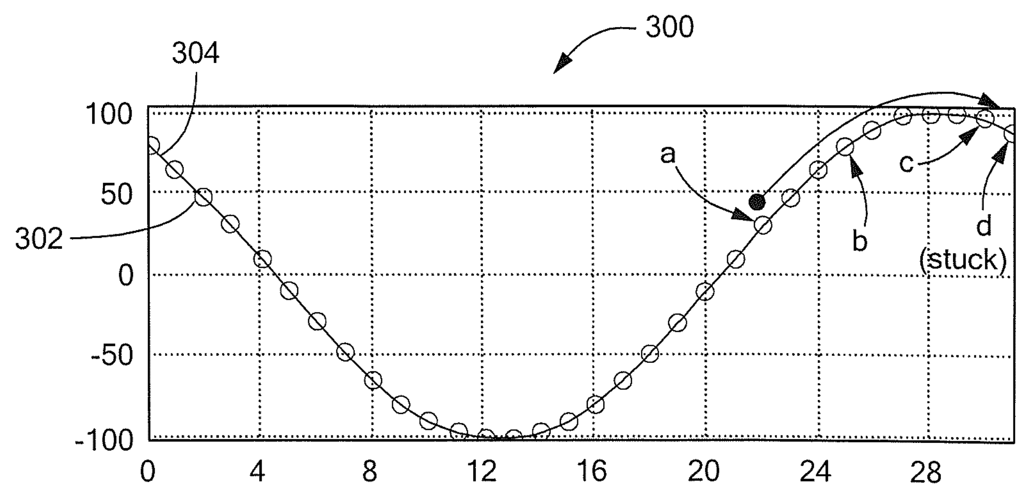
FIG. 13 is a graph showing an additional exemplary output signal data points generated by the circuit of FIG. 11.

Referring now to FIG. 13, using the above example, but starting at a new point “a”=22, at the new point “a,” the preprocessed output signal 266*a* is positive. Thus the integrated signal 268*a* of FIG. 11 will trend more positive. Therefore the index value signal 270*a* and associated preprocessed signal 266*a* will move upward through data points “b,” “c,” and will eventually become stuck at a data point “d,” which data point is not representative of the pointing direction of the magnetic field.

Thus while the circuit 260 of FIG. 11 may be suitable in some applications, generally, when used with a CVH sensing element to sense rotations of the magnetic field through three hundred sixty degrees, other post-processing circuits can be used, for example, circuits and techniques shown and described below in conjunction with FIGS. 14 and 15.

Figure 14:
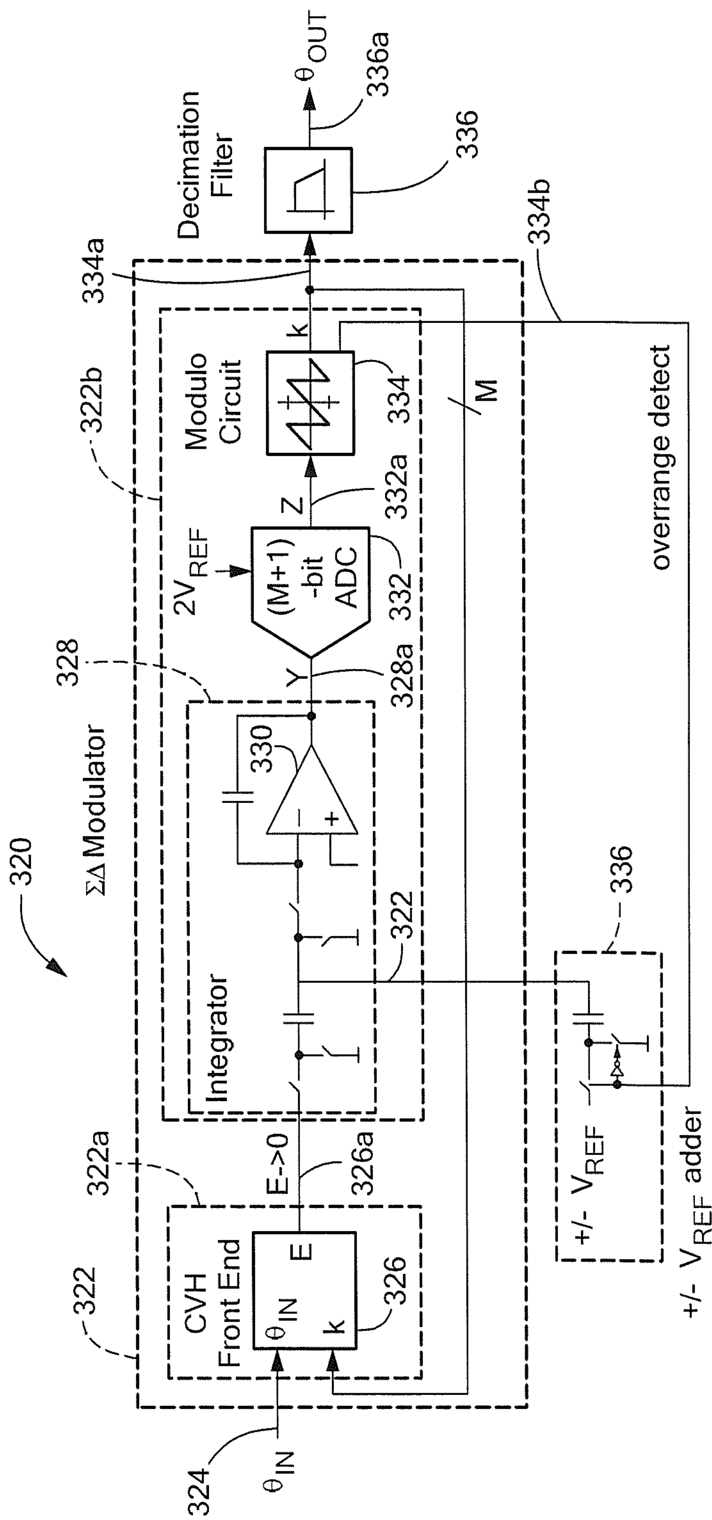
FIG. 14 is a block diagram showing other exemplary circuits that can be used to provide the preprocessing circuit and the post processing circuit of FIG. 3.

Referring now to FIG. 14, a circuit 320 includes a preprocessing circuit 322*a* coupled to a post-processing circuit 322*b*. The preprocessing circuit 322*a* can be the same as or similar to any of the preprocessing circuits described above in conjunction with FIG. 3, 4, or 5. Similarly, the post-processing circuit 322*b* can be the same as or similar to either of the post-processing circuits described above in conjunction with FIGS. 3, 4, and 5.

Unlike the post processing circuit 262*b* of FIG. 11, the post processing circuit 322*b* does not become stuck at a value that is not representative of the input magnetic field.

The preprocessing circuit 322*a* and the post-processing circuit 322*b* are coupled to an arrangement similar to a sigma delta modulator. The post-processing circuit can include, for example, an analog filter 328 (integrator, here shown as a switched capacitor integrator) coupled to receive a preprocessed signal 326*a*, and configured to generate an integrated signal 328*a*. The post processing circuit 322*b* can also include an analog-to-digital converter 332 coupled to receive the integrated signal 328*a* and configured to generate a converted signal 332*a*.

Unlike the post processing circuit 262*b* of FIG. 11, the post processing circuit 322*b* can include a modulo circuit 334 coupled to receive the converted signal 332*a* and configured to generate a modulo signal 334*a*, which corresponds to the index value signal 334*a* received by the preprocessing circuit 322*a*, and which corresponds to an angle output signal 334*a* (i.e., an x-y angle signal), which can be representative of an angle of a sensed parameter, e.g., an angle of a magnetic field.

In some embodiments, the circuit 320 can also include another filter circuit, for example, a decimation filter circuit 336, coupled to receive the index value signal 334*a* and configured to generate a filtered output signal 336*a*. The filter 336 can be used to average the outputs to provide more resolution than the number of choices for the index value, k, which is determined by the nature of CVH sensing element. A decimation filter may be preferred because output samples are generally not needed as fast as the update rate for the index value, k, and the filter 336 can be much simpler if it is a decimation filter.

The modulo circuit 334 can also be configured to generate a so-called “over-range signal” 334*b*. An adder circuit 336, which can also be formed from switched capacitors, can be coupled to receive the over-range signal 334 and configured to generate a step signal 322 that is summed into the switched capacitor filter circuit 328.

In some embodiments, the index value signal 334*a* has M+1 bits (compared with the M bits of the index value signal 270*a* of FIG. 11).

The range of the analog-to-digital converter 332 is larger than the range of the analog-to-digital converter 270 of FIG. 11 so that the analog-to-digital converter 332 can sense when its input goes beyond the normal range of FIG. 11, without saturating. In some embodiments, the range of the analog-to-digital converter 332 is larger than the range of the analog-to-digital converter 270 by one bit. However, in other embodiments, the range of the analog-to-digital converter 332 can larger than the range of the analog-to-digital converter 270 by less than one bit or by more than one bit.

In some embodiments, the analog filter 328 contains a single integrator, which would make the circuit 320 be like a first order sigma-delta converter. However, any number of integrators can be used, thus, the circuit 320 can be like a signal-delta converter having an order greater than one.

Operation of the modulo circuit can be understood from Table 1 below.

TABLE 1

| Range of converted signal (Z) (332a) | Value of index value sig. (k) (334a) | Effect of over-range signal (334b) |
|---|---|---|
| Z < 0 | k = Z + 32 | Add Vref to int. sig. 328a |
| 0 <= Z < 32 | k = Z | none |
| Z >= 32 | k = Z − 32 | Sub. Vref from int. sig. 328a |

Adding or subtracting Vref from the filtered signal 328*a* does not change the resulting value, k, of the index value signal 334*a*, but the adding or subtracting does cause the integrated signal 328*a* to avoid growing without bound.

Overall operation of the circuit 320 is described below in conjunction with FIG. 15.

Figure 15:
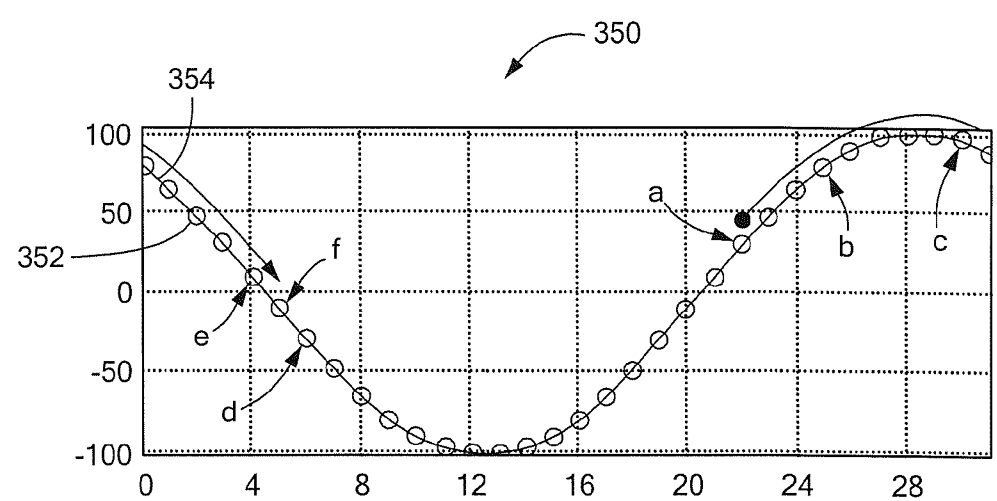
FIG. 15 is a graph showing exemplary output signal data points generated by the circuit of FIG. 14.

Referring now to FIG. 15, a graph 350 has a horizontal axis with a scale in units of values of the index value signal 334*a* of FIG. 14, presuming that the index value signal 334*a* has a five bit range (32 values). It should be understood that an index value corresponds to a selection of one of the vertical Hall elements within a CVH sensing element (or, in accordance with FIGS. 5 and 7-10, one partial inversion and summation of Hall effect elements within the CVH sensing element). The graph 350 also has a vertical axis with a scale in units of amplitude in arbitrary units of the preprocessed signal 326*a* of FIG. 11. e.g., in millivolts. The graph 350 includes data points of which a data 352 is but one example. A sinusoid 354 is included to show an ideal behavior of the data points. Offset voltages are not shown in FIG. 15.

As described above in conjunction with FIG. 3, the preprocessing circuit 322*a* is coupled to receive sensing element signals 324, for example, magnetic field sensing element signals, coupled to receive an index value signal 334*a*, and configured to generate a preprocessed signal 326*a*. The post-processing circuit 322*b* is coupled to receive the preprocessed signal 326*a* and configured to generate the index value signal 334*a*.

From discussion above and below, it will be understood that the circuit 320 of FIG. 14, for a stationary magnetic field, does not generate all of the data points shown in FIG. 15 either sequentially or at the same time, i.e., the circuit 320 does not select all of the vertical Hall elements within the CVH sensing element either sequentially or at the same time. Rather, for a stationary magnetic field, the circuit 320 seeks but one of the data points, i.e., one value of the preprocessed output signal 326*a*, i.e. one selected vertical Hall element within the CVH sensing element, and the one data point is indicative of a direction of the magnetic field sensed by the circuit 320. This is further described by example below.

From inspection of the data points, like in the graphs of FIGS. 12 and 13, it will again be understood that vertical Hall elements number 12 and number 28 are most sensitive to magnetic field (or, in accordance with FIGS. 5 and 7-10, partial inversions and summations with index values 12 and 28). Thus, vertical Hall elements 12 and 28, or rather, lines drawn between vertical Hall element contacts of vertical Hall elements 12 and 28 are nearly perpendicular to the sensed magnetic field. Similarly, vertical Hall elements 4 and 20 are nearly parallel to the magnetic field and produce nearly zero output. In other words, the sensed magnetic field has a pointing direction at forty-five degrees relative to magnetic field sensing element number zero.

The circuit, for example, the circuit 320 of FIG. 14, may or may not include chopping. Similarly the data points of FIG. 15 may or may not be representative of chopping.

The data points of FIG. 15 represent that there is but one average value for the index value signal, i.e., index value, k, namely 4.5 (i.e., a toggling between points at k=4 and k=5), that can be achieved by the circuit 320 for the example of the stationary magnetic field pointing at two hundred seventy degrees. Thus, the circuit 320 can provide an unambiguous result as to the pointing direction of the magnetic field for any stationary magnetic field, and does not get "stuck" at a wrong point as described above in conjunction with FIG. 13.

To explain the above improved behavior, suppose that the integrated signal 328*a* of FIG. 15 at a time t=0 is such that the output signal from the analog-to-digital converter 332*a* is equal to 22 (i.e., vertical Hall element 22 is selected), which corresponds to data point "a" of FIG. 13, which is like the data point "a" of FIG. 13. At the point "a," the preprocessed output signal 326*a* is positive. Thus the integrated signal 328*a* of FIG. 15 will trend more positive. Therefore the converted signal 332*a* will move upward through data points "b," "c," but will not become stuck at the data point "d" of FIG. 12. Instead, according to Table 1, as the converted signal 332*a* exceeds a value of 32, the over-range signal 334*b* will cause a subtraction to occur at the filter circuit 328, causing the data points to jump from "c" to a new data point "d." Once at the point "d," the circuit operates as described above in conjunction with FIG. 12, and the circuit 320 will find a toggle point between points "e" and "f."

Figure 16:
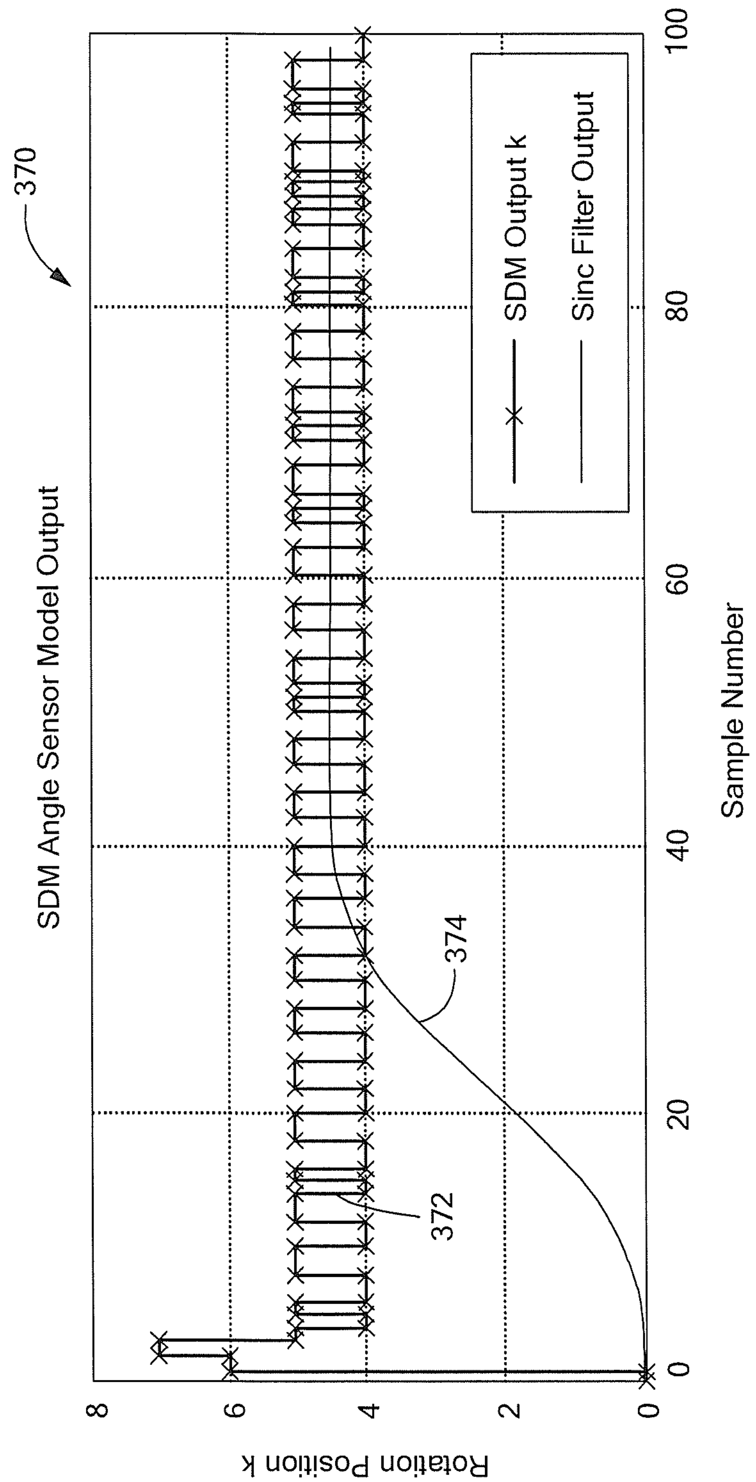
FIG. 16 is a graph showing exemplary output signal data points generated by the circuit of FIG. 14 having passed through an additional filter.

Referring now to FIG. 16, a graph 370 includes a horizontal axis with a scale in units of sample number, corresponding to a number of a sample (i.e., a time index) of the index value signal 334*a* of FIG. 14. The graph 370 also includes a vertical axis with a scale in units of rotation position, k, i.e., the converged index value of the index value signal 334*a*.

The graphs 370 includes a signal 372 representative of the index value signal 334*a* of FIG. 14, generally toggling between values of 4 and 5 for reasons discussed above.

The graph 370 also includes a signal 374 representative of the filtered output signal 336*a* of FIG. 14, which settles at or near a value of 4.5, the exact value depending upon a number of occurrences of the value 4 versus a number of occurrences of the number 5 in the index value signal 372. Thus, it should be apparent that the signal 336*a* of FIG. 14 can be a smoothed signal having less variation than the index value signal 334*a*, due, for example, to operation of a decimation filter like the decimation filter 336*a*.

Figure 17:
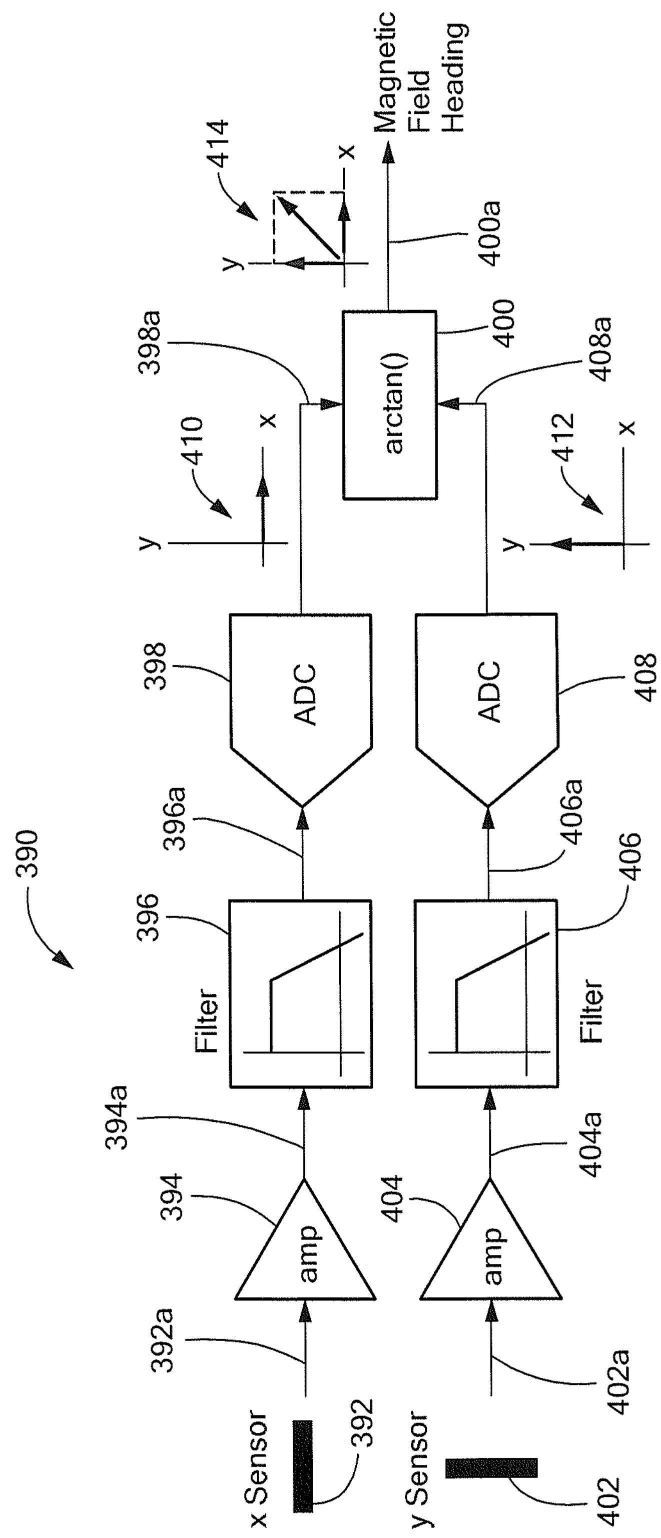
FIG. 17 is a block diagram showing an exemplary compass circuit.

Referring now to FIG. 17, a circuit 390 can include an x channel derived from an x-axis magnetic field sensor 392 and a y channel derived from a y-axis magnetic field sensor 402.

The x-axis magnetic field sensor 392 is configured to generate a magnetic field signal 392*a* responsive to a component of a magnetic field in an x direction. The y-axis magnetic field sensor 402 is configured to generate a magnetic field signal 402*a* responsive to a component of the magnetic field in a y direction orthogonal to the x direction.

The x channel includes an amplifier 394 coupled to receive the magnetic field signal 392*a* and configured to generate an amplified signal 394*a*. The x channel also includes a filter circuit 396 coupled to receive the amplified signal 394*a* and configured to generate a filtered signal 396*a*. The x channel also includes an analog-to-digital converter 398 coupled to receive the filtered signal 396*a* and configured to generate a converted signal 398*a*, which is a digital signal having any number of bits.

Similarly, the y channel includes an amplifier 404 coupled to receive the magnetic field signal 402*a* and configured to generate an amplified signal 404*a*. The y channel also includes a filter circuit 406 coupled to receive the amplified signal 404*a* and configured to generate a filtered signal 406*a*. The y channel also includes an analog-to-digital converter 408 coupled to receive the filtered signal 406*a* and configured to generate a converted signal 408*a*, which is a digital signal having any number of bits.

An arctangent circuit 400 is coupled to receive the two converted signals 398*a*, 408*a* and configured to generate an arctangent of the two converted signals as an output signal 400*a* representative of a pointing direction of the magnetic field in the x-y plane in which the x sensor and a y sensor 392, 402, respectively, are sensitive.

A graph 410 has a vector representative of the converted signal 398*a*. A graph 412 has a vector representative of the converted signal 408*a*. A graph 414 has a vector representative of the arctangent of the converted signals 398*a*, 408*a*.

Figure 18:
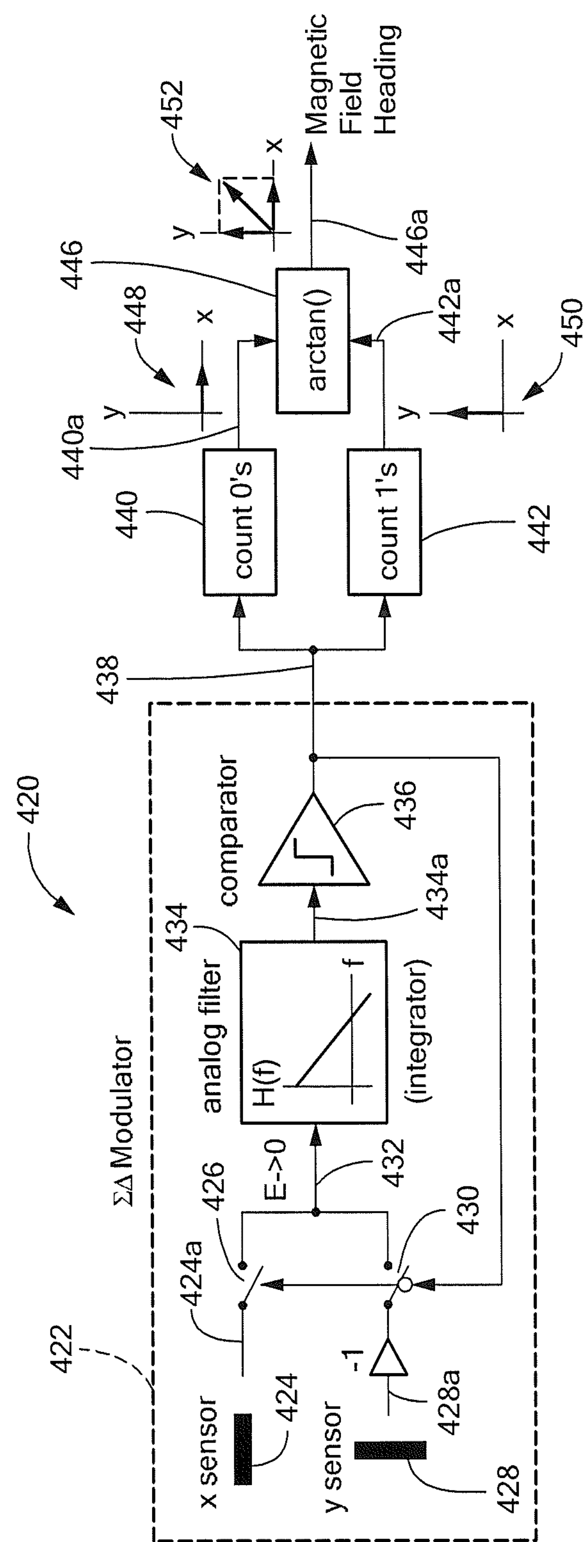
FIG. 18 is a block diagram showing another exemplary compass circuit.

Referring now to FIG. 18, another circuit 420 can include an x channel derived from an x-axis magnetic field sensor 424 and a y channel derived from a y-axis magnetic field sensor 428.

The x-axis magnetic field sensor 424 is configured to generate a magnetic field signal 424*a* responsive to a component of a magnetic field in an x direction. The y-axis magnetic field sensor 428 is configured to generate a magnetic field signal 428*a* responsive to a component of the magnetic field in a y direction orthogonal to the x direction.

The circuit 420 includes a switching circuit having switches 426, 430. The switching circuit is coupled to receive the magnetic field signal 424*a* and an inverted version of the magnetic field signal 428*a*. The switches 426, 430 operate alternately, resulting in a signal 432, which is like the preprocessed signal 64*a* of FIG. 3. It will be recognized that the switches 426, 430 are like the preprocessing circuit 64 of FIG. 3, and like the switching circuit of FIG. 6.

The circuit 420 also includes a filter circuit 434 coupled to receive the signal 432 and configured to generate an integrated signal 434*a*. A comparator 436 is coupled to receive the integrated signal 434*a* and configured to generate a comparison signal 438. The switches 426, 430 are coupled to receive the comparison signal 438. The comparison signal 438 is like the index value signal 66*a* of FIG. 3, or like the index value signal 92*b* of FIG. 4.

It can be observed that a circuit portion 422 is like a circuit portion 262 of FIG. 11. A count zeros circuit 440 and a count ones circuit 442 are coupled to receive the comparison signal 438. The count zeros circuit 440 is configured to generate a signal 440*a* representative of a count of the number of zeros in the comparison signal 438 in a predetermined time period. Similarly, the count ones circuit 442 is configured to generate a signal 442*a* representative of a count of the number of ones in the comparison signal 438 in the predetermined time period.

An arctangent circuit 446 is coupled to receive the signals 440*a*, 442*a* and configured to generate an arctangent of the two signals as an output signal 446*a* representative of a pointing direction of the magnetic field in an x-y plane in which the x sensor and a y sensor 424, 428 respectively, are sensitive.

Is should be recognized that the circuit 420 is operable to select values from the signal 438 so that, over time, an average of the signal 432 is zero. The arctangent of the number of zeroes divided by the number of ones is representative of the input angle, provided the angle remains between 0 and 90 degrees. Other switching arrangements and other similar circuits can be used to resolve angles from ninety to three hundred sixty degrees.

A graph 448 has a vector representative of a value of the signal 440*a*. A graph 450 has a vector representative of a value of the signal 442*a*. A graph 452 has a vector representative of the arctangent of the signals 398*a*, 408*a*.

It will be understood that the circuits 390, 420 of FIGS. 17 and 18, respectively, can provide compass circuits used to indicate a direction of the earth's magnetic field in a plane tangent to a surface of the earth, or in any other plane.

The circuit 420 of FIG. 18 has an advantage over the circuit 390 of FIG. 17. Namely, the circuit 390 FIG. 17 has two signal paths, which must match in gain and phase in order to achieve accuracy, resulting in more complex circuitry. In contrast, the circuit 420 FIG. 18 has a shared signal path, eliminating possible mismatch in the measurements of the x and y sensors.

While the circuits 390, 420 show magnetic field sensing elements, the circuits 390, 420 can be used with any type of sensing elements or with any type of measuring devices that have directional responses. While circuits and techniques are described above that use circuit topologies that are described to be similar to a sigma-delta converter, it should be understood that other circuit topologies can be used, each or which can generate and index value signal similar to the index value signals described in conjunction with FIGS. 3-5, 11, 14, 17, and 18, each of which has an analog-to-digital converter to generate the index value signal. In some embodiments, the analog-to-digital converter is a comparator having a one bit output.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An electronic circuit, comprising:

a plurality of measuring devices to generate a corresponding plurality of measuring device signals, each one of the plurality of measuring device signals having a respective magnitude related to an angle of a direction of a sensed parameter;

a preprocessing circuit coupled to receive a signal representative of the plurality of measuring device signals, coupled to receive an index value identifying as selection of one or more measuring devices from among the plurality of measuring devices, and configured to generate either a first preprocessed output signal representative of a selected one or more of the plurality of measuring device signals selected in accordance with the index value or a second preprocessed output signal representative of a sum of a selected set of signals representative of the plurality of measuring device signals selected in accordance with the index value; and a post processing circuit coupled to receive the first or the second preprocessed output signal and configured to relate a crossing of a predetermined value of the first or the second preprocessed output signal to the index value, wherein the crossing of the predetermined value is representative of the angle of the direction of the sensed parameter, wherein the post processing circuit comprises:

an analog-to-digital converter coupled to receive a signal representative of the first or the second preprocessed output signal and configured to generate a digital converted signal, wherein the digital converted signal corresponds to the index value, wherein there preprocessing circuit is coupled to receive the index value in a feedback arrangement, wherein the index value is generated by the post processing circuit.

2. The circuit of claim 1, further comprising:

an integrator coupled to receive the first or the second preprocessed output signal and configured to generate an integrated signal, wherein the analog-to-digital converter is coupled to receive the integrated signal and configured to generate the digital converted signal in accordance with the integrated signal.

3. The circuit of claim 2, wherein the post processing circuit further comprises a digital filter coupled to receive the digital converted signal and configured to filter the digital converted signal to provide a digital filtered signal representative of the angle of the direction of the sensed parameter.

4. The circuit of claim 3, wherein the digital filter comprises a decimation filter.

5. The circuit of claim 2, wherein the post processing circuit further comprises:

a count circuit coupled to receive the digital converted signal and configured to generate first and second count values corresponding to counts of a number of occurrences of a zero and a one, respectively, in the least significant bit of the digital converted signal within a time period; and a comparison circuit configured to compare the first count value to the second count value and configured to generate a count comparison value representative of the angle of the direction of the sensed parameter.

6. The circuit of claim 1, further comprising:

an integrator coupled to receive the first or the second preprocessed output signal and configured to generate an integrated signal, wherein the analog-to-digital converter is coupled to receive the integrated signal and configured to generate the digital converted signal as a multi-bit digital converted signal in accordance with the integrated signal; and a modulo circuit coupled to receive the multi-bit digital converted signal, configured to add or subtract a predetermined value to or from the multi-bit digital converted signal depending upon whether the multi-bit digital converted signal is below or above a predetermined value range, respectively, and configured to generate a multi-bit digital modulo signal, wherein the multi-bit digital modulo signal corresponds to the index value.

7. The circuit of claim 6, wherein the post processing circuit further comprises a digital filter coupled to receive the digital multi-bit module signal and configured to filter the digital multi-bit module signal to provide a digital filtered signal representative of the angle of the direction of the sensed parameter.

8. The circuit of claim 7, wherein the digital filter comprises a decimation filter.

9. The circuit of claim 1, wherein the plurality of measuring devices comprises a plurality of vertical Hall elements arranged in a circular vertical Hall element (CVH) structure over a common implant region in a common substrate, and wherein the sensed parameter is a magnetic field.

10. The circuit of claim 9, further comprising an integrator coupled to receive the first or the second preprocessed output signal and configured to generate an integrated signal, wherein the analog-to-digital converter is coupled to receive the integrated signal and configured to generate the digital converted signal in accordance with the integrated signal.

11. The circuit of claim 10, wherein the post processing circuit further comprises a digital filter coupled to receive the digital converted signal and configured to filter the digital converted signal to provide a digital filtered signal representative of the angle of the direction of the magnetic field.

12. The circuit of claim 11, wherein the digital filter comprises a decimation filter.

13. The circuit of claim 9, further comprising:

an integrator coupled to receive the first or the second preprocessed output signal and configured to generate an integrated signal, wherein the analog-to-digital converter is coupled to receive the integrated signal and configured to generate the digital converted signal as a multi-bit digital converted signal in accordance with the integrated signal; and a modulo circuit coupled to receive the multi-bit digital converted signal, configured to add or subtract a predetermined value to or from the multi-bit digital converted signal depending upon whether the multi-bit digital converted signal is below or above a predetermined value range, respectively, and configured to generate as multi-bit digital modulo signal, wherein the multi-bit digital modulo signal corresponds to the index value.

14. The circuit of claim 13, wherein the post processing circuit further comprises a digital filter coupled to receive the digital multi-bit modulo signal and configured to filter the multi-bit digital modulo signal to provide a digital filtered signal representative of the angle of the direction of the magnetic field.

15. The circuit of claim 14, wherein the digital filter comprises a decimation filter.

16. The circuit of claim 1, wherein the plurality of measuring devices comprises a plurality of magnetic field sensing elements, and wherein the sensed parameter is a magnetic field.

17. The circuit of claim 16, wherein the circuit is disposed upon a common substrate, and wherein the plurality of measuring device signals is responsive to an angle of a direction of a magnetic field.

18. The circuit of claim 16, wherein the plurality of measuring devices comprises a plurality of vertical Hall elements disposed on the common substrate.

19. A method of processing a plurality of measuring device signals generated by a plurality of measuring devices, comprising:

receiving a signal representative of the plurality measuring device signals, each one of the plurality of measuring device signals having a respective magnitude related to an angle of a direction of a sensed parameter;

receiving an index value identifying a selection of one or more measuring devices from among the plurality of measuring devices;

generating either a first preprocessed output signal representative of a selected one or more of the plurality of measuring device signals selected in accordance with the index value or a second preprocessed output signal representative of a sum of a selected set of signals representative of the plurality of measuring device signals selected in accordance with the index value; and relating a crossing of a predetermined value of the first or the second preprocessed output signal to the index value, wherein the crossing of a predetermined value is representative of the angle of the direction of the sensed parameter, wherein the relating comprises;

converting a signal representative of the first or the second preprocessed output signal with an analog-to-digital converter to generate a digital converted signal, wherein the digital converted signal corresponds to the index value; and feeding back the index value to the step of receiving the index value.

20. The method of claim 19, further comprising:

integrating the first or the second preprocessed output signal to generate an integrated signal, wherein the converting comprises:

converting the integrated signal to generate the digital converted signal.

21. The method of claim 20, further comprising digital filtering the digital converted signal to provide a digital filtered signal representative of the angle of the direction of the sensed parameter.

22. The method of claim 21, wherein the digital filtering comprises decimating.

23. The method of claim 20, further comprising:

generating a first count value corresponding to a count of a number of occurrences of a zero in the least significant bit of the digital converted signal within a time period;

generating a second count value corresponding to a count of a number of occurrences of a one in the least significant bit of the digital converted signal within the time period; and comparing the first count value to the second count value to generate a count comparison value representative of the angle of the direction of the sensed parameter.

24. The method of claim 19, further comprising:

integrating the first or the second preprocessed output signal to generate an integrated signal, wherein the converting comprises converting the integrated signal to generate the digital converted signal as a multi-bit digital converted signal; and adding or subtracting a predetermined value to or from the digital multi-bit converted signal depending upon whether the multi-bit digital converted signal is below or above a predetermined value range, respectively, generate a multi-bit digital modulo signal, wherein the multi bit digital modulo signal corresponds to the index value.

25. The method of claim 24, further comprising digital filtering the multi-bit digital modulo signal to provide a digital filtered signal representative of the angle of the direction of the sensed parameter.

26. The method of claim 25, wherein the digital filtering comprises decimating.

27. The method of claim 19, wherein the plurality of measuring devices comprises a plurality of vertical Hall elements arranged in a circular vertical Hall element (CVH) structure over a common implant region in a common substrate, and wherein the sensed parameter is a magnetic field.

28. The method of claim 27, further comprising:

integrating the first or the second preprocessed output signal to generate an integrated signal, wherein the converting comprises:

converting the integrated signal to generate the digital converted signal.

29. The method of claim 28, further comprising digital filtering the digital converted signal to provide a digital filtered signal representative of the angle of the direction of the magnetic field.

30. The method of claim 28, wherein the digital filtering comprises decimating.

31. The method of claim 27, further comprising:

integrating the first or the second preprocessed output signal to generate an integrated signal, wherein the converting comprises converting the integrated signal to generate the digital converted signal as a multi-bit digital converted signal; and adding or subtracting a predetermined value to or from the digital multi-bit converted signal depending upon whether the multi-bit digital converted signal is below or above a predetermined value range, respectively, to generate a multi-bit digital modulo signal, wherein the multi-bit digital modulo signal corresponds to the index value.

32. The method of claim 31, further comprising digital filtering the digital multi-bit modulo signal to provide a digital filtered signal representative of the angle of the direction of the magnetic field.

33. The method of claim 31, wherein the digital filtering comprises decimating.

34. The method of claim 19, wherein the plurality of measuring devices comprises a plurality of magnetic field sensing elements, and wherein the sensed parameter is a magnetic field.

35. The method of claim 34, wherein the plurality of measuring devices comprises a plurality of vertical Hall elements disposed on the common substrate.

* * * * *

UNITED STATES PATENT AND TRADEMARK OFFICE

CERTIFICATE OF CORRECTION

PATENT NO. : 8,860,410 B2
APPLICATION NO. : 13/113603
DATED : October 14, 2014
INVENTOR(S) : Craig S. Petrie It is certified that error appears in the above-identified patent and that said Letters Patent is hereby corrected as shown below:

Specification

Column 1, line 42 delete "to magnetic field" and replace with --to magnetic fields--.

Column 1, line 44 delete "to magnetic field" and replace with --to magnetic fields--.

Column 2, line 58 delete ", and" and replace with --, an--.

Column 2, line 61 delete "plurality measuring" and replace with --plurality of measuring--.

Column 3, line 28 delete "plurality measuring" and replace with --plurality of measuring--.

Column 4, line 38 delete "showing an additional" and replace with --showing additional--.

Column 8, line 55 delete "above-describe" and replace with --above-described--.

Column 9, line 9 delete "and" and replace with --an--.

Column 9, line 17 delete "is disposed" and replace with --disposed--.

Column 9, line 41 delete "describe," and replace with --described,--.

Column 9, line 44 delete "104" and replace with --104.--.

Column 9, line 53 delete "signal; 108a" and replace with --signal 108a--.

Column 10, line 34 delete ". Outputs" and replace with --. Output--.

Column 12, line 55 delete "FIG. 9A." and replace with --FIG. 9A).--.

Column 14, line 17 delete "FIG. 3, 4, or 5." and replace with --FIGS. 3, 4, or 5.--.

Column 16, line 29 delete "FIG. 3, 4, or 5." and replace with --FIGS. 3, 4, or 5.--.

Signed and Sealed this
Twelfth Day of July, 2016

Michelle K. Lee

Michelle K. Lee
*Director of the United States Patent and Trademark Office*

Column 17, lines 14-15 delete "can larger" and replace with --can be larger--.

Column 17, line 21 delete "signal-delta" and replace with --sigma-delta--.

Column 20, line 16 delete "Is should" and replace with --It should--.

Column 20, line 33 delete "circuit 390 FIG. 17" and replace with --circuit 390 of FIG. 17--.

Column 20, line 45 delete ", each or which" and replace with --, each of which--.

Column 20, line 46 delete "and" and replace with --an--.

Column 20, line 59 delete "that that" and replace with --that the--.

Claims

Column 22, line 49 claim 15 delete "as" and replace with --a--.

Column 24, lines 7-8 claim 24 delete ", generate" and replace with --, to generate--.